United States Patent
Umezaki

(10) Patent No.: US 10,777,290 B2
(45) Date of Patent: Sep. 15, 2020

(54) SEMICONDUCTOR DEVICE

(71) Applicant: Semiconductor Energy Laboratory Co., Ltd., Kanagawa-ken (JP)

(72) Inventor: Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 17 days.

(21) Appl. No.: 16/501,539

(22) Filed: Apr. 26, 2019

(65) Prior Publication Data

US 2019/0318795 A1 Oct. 17, 2019

Related U.S. Application Data

(63) Continuation of application No. 15/464,689, filed on Mar. 21, 2017, now Pat. No. 10,297,332, which is a (Continued)

(30) Foreign Application Priority Data

Feb. 29, 2012 (JP) .................................. 2012-042864

(51) Int. Cl.
*G11C 19/00* (2006.01)
*G11C 19/28* (2006.01)
(Continued)

(52) U.S. Cl.
CPC .............. *G11C 19/28* (2013.01); *G09G 3/20* (2013.01); *G11C 19/287* (2013.01);
(Continued)

(58) Field of Classification Search
None
See application file for complete search history.

(56) References Cited

U.S. PATENT DOCUMENTS 6,845,140 B2  1/2005  Moon et al.
6,975,142 B2  12/2005 Azami et al.
(Continued)

FOREIGN PATENT DOCUMENTS

EP  1 253 718 A1  10/2002
EP  1 770 788 A2  4/2007
(Continued)

OTHER PUBLICATIONS

Notice of Reasons for Refusal re Application No. JP 2017-001501, dated Sep. 5, 2017 (with English translation).
(Continued)

*Primary Examiner* — Tuan T Lam
(74) *Attorney, Agent, or Firm* — Husch Blackwell LLP

(57) ABSTRACT

A semiconductor device which shifts a low-level signal is provided. In an example, a first transistor including a first terminal electrically connected to a first wiring and a second terminal electrically connected to a second wiring, a second transistor including a first terminal electrically connected to a third wiring and a second terminal electrically connected to the second wiring, a third transistor including a first terminal electrically connected to a fourth wiring and a second terminal electrically connected to a gate of the second transistor, a fourth transistor including a first terminal electrically connected to a fifth wiring, a second terminal electrically connected to a gate of the third transistor, and a gate electrically connected to a sixth wiring, and a first switch including a first terminal electrically connected to the third wiring and a second terminal electrically connected to a gate of the first transistor are included.

3 Claims, 15 Drawing Sheets

Related U.S. Application Data continuation of application No. 14/713,941, filed on May 15, 2015, now Pat. No. 9,608,010, which is a continuation of application No. 13/775,854, filed on Feb. 25, 2013, now Pat. No. 9,036,766.

(51) Int. Cl.
*H01L 27/088* (2006.01)
*H01L 27/12* (2006.01)
*G09G 3/20* (2006.01)
*H01L 27/15* (2006.01)
*H01L 29/786* (2006.01)
*G09G 3/36* (2006.01)
*H01L 27/32* (2006.01)

(52) U.S. Cl.
CPC .......... *H01L 27/088* (2013.01); *H01L 27/124* (2013.01); *H01L 27/1225* (2013.01); *H01L 27/156* (2013.01); *H01L 29/7869* (2013.01); *G09G 3/2092* (2013.01); *G09G 3/3677* (2013.01); *G09G 2310/0267* (2013.01); *G09G 2310/0286* (2013.01); *H01L 27/3244* (2013.01)

(56) References Cited

U.S. PATENT DOCUMENTS

| | | | |
|---|---|---|---|
| 7,038,653 B2 * | 5/2006 | Moon | G09G 3/3677 345/100 |
| 7,068,076 B2 | 6/2006 | Azami | |
| 7,109,952 B2 | 9/2006 | Kwon | |
| 7,292,218 B2 | 11/2007 | Lin et al. | |
| 7,403,038 B2 | 7/2008 | Azami | |
| 7,446,748 B2 | 11/2008 | Jang et al. | |
| 7,561,656 B2 | 7/2009 | Chang et al. | |
| 7,586,478 B2 | 9/2009 | Azami et al. | |
| 7,674,650 B2 | 3/2010 | Akimoto et al. | |
| 7,696,974 B2 | 4/2010 | Moon et al. | |
| 7,732,819 B2 | 6/2010 | Akimoto et al. | |
| 7,786,972 B2 | 8/2010 | Jeong et al. | |
| 7,800,576 B2 | 9/2010 | Jinta | |
| 7,903,079 B2 | 3/2011 | Azami et al. | |
| 7,907,113 B2 | 3/2011 | Jang et al. | |
| 7,910,490 B2 | 3/2011 | Akimoto et al. | |
| 7,932,521 B2 | 4/2011 | Akimoto et al. | |
| 8,165,262 B2 | 4/2012 | Lai | |
| 8,199,870 B2 | 6/2012 | Shang et al. | |
| 8,274,077 B2 | 9/2012 | Akimoto et al. | |
| 8,284,151 B2 | 10/2012 | Azami et al. | |
| 8,289,309 B2 | 10/2012 | Yamamoto et al. | |
| 8,299,982 B2 | 10/2012 | Chung | |
| 8,384,702 B2 | 2/2013 | Jinta | |
| 8,416,157 B2 | 4/2013 | Lee et al. | |
| 8,422,622 B2 | 4/2013 | Nakamizo et al. | |
| 8,466,463 B2 | 6/2013 | Akimoto et al. | |
| 8,581,825 B2 | 11/2013 | Jang et al. | |
| 8,582,715 B2 | 11/2013 | Chung et al. | |
| 8,629,069 B2 | 1/2014 | Akimoto et al. | |
| 8,659,532 B2 | 2/2014 | Azami et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 9,036,766 B2 | 5/2015 | Umezaki | |
| 9,099,562 B2 | 8/2015 | Akimoto et al. | |
| 9,129,562 B2 | 9/2015 | Jang et al. | |
| 9,336,897 B2 | 5/2016 | Tobita et al. | |
| 9,608,010 B2 | 3/2017 | Umezaki | |
| 9,672,782 B2 | 6/2017 | Lee et al. | |
| 10,297,332 B2 | 5/2019 | Umezaki | |
| 10,403,221 B2 | 9/2019 | Lee et al. | |
| 2002/0158666 A1 | 10/2002 | Azami et al. | |
| 2003/0227262 A1 | 12/2003 | Kwon | |
| 2004/0165692 A1 | 8/2004 | Moon et al. | |
| 2005/0220262 A1 | 10/2005 | Moon | |
| 2006/0146978 A1 * | 7/2006 | Jang | G09G 3/3677 377/64 |
| 2006/0269038 A1 | 11/2006 | Jang et al. | |
| 2007/0001953 A1 | 1/2007 | Jang et al. | |
| 2008/0056430 A1 | 3/2008 | Chang et al. | |
| 2008/0088543 A1 | 4/2008 | Shibusawa | |
| 2008/0130822 A1 | 6/2008 | Hsu et al. | |
| 2008/0211744 A1 | 9/2008 | Lee | |
| 2008/0211745 A1 | 9/2008 | Lee et al. | |
| 2008/0308805 A1 | 12/2008 | Akimoto et al. | |
| 2009/0262051 A1 | 10/2009 | Kim et al. | |
| 2010/0164854 A1 | 7/2010 | Kim et al. | |
| 2011/0058640 A1 | 3/2011 | Shang et al. | |
| 2011/0104851 A1 | 5/2011 | Akimoto et al. | |
| 2011/0121290 A1 | 5/2011 | Akimoto et al. | |
| 2011/0187691 A1 | 8/2011 | Chung | |
| 2011/0242080 A1 | 10/2011 | Yamamoto et al. | |
| 2011/0286572 A1 | 11/2011 | Shang et al. | |
| 2012/0105397 A1 | 5/2012 | Tan et al. | |
| 2012/0113088 A1 | 5/2012 | Han et al. | |
| 2012/0262438 A1 | 10/2012 | Shang et al. | |
| 2013/0077736 A1 | 3/2013 | Son | |
| 2013/0136224 A1 | 5/2013 | Qing et al. | |
| 2013/0342516 A1 | 12/2013 | Shang | |
| 2014/0070880 A1 | 3/2014 | Umezaki | |
| 2014/0079176 A1 | 3/2014 | Qian et al. | |
| 2014/0159045 A1 | 6/2014 | Azami et al. | |
| 2015/0340513 A1 | 11/2015 | Akimoto et al. | |
| 2019/0392775 A1 | 12/2019 | Lee et al. | |

FOREIGN PATENT DOCUMENTS

| | | |
|---|---|---|
| EP | 1 965 370 A2 | 9/2008 |
| EP | 1 965 371 A2 | 9/2008 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| JP | 64-062019 A | 3/1989 |
| JP | 2002-328643 A | 11/2002 |
| JP | 2003-043976 A | 2/2003 |
| JP | 2003-323152 A | 11/2003 |
| JP | 2004-029791 A | 1/2004 |
| JP | 2004-78172 | 3/2004 |
| JP | 2004-078172 A | 3/2004 |
| JP | 2004-103226 A | 4/2004 |
| JP | 2005-143068 A | 6/2005 |
| JP | 2005-149691 A | 6/2005 |
| JP | 2006-113524 A | 4/2006 |
| JP | 2007-123861 | 5/2007 |
| JP | 2007-123861 A | 5/2007 |
| JP | 2008-216960 A | 9/2008 |
| JP | 2008-216961 A | 9/2008 |
| JP | 2011-060411 A | 3/2011 |
| JP | 2011-113096 A | 6/2011 |
| JP | 2011-164133 A | 8/2011 |
| JP | 2011-217175 A | 10/2011 |
| JP | 2013-211088 A | 10/2013 |
| WO | WO 2003/107314 A2 | 12/2003 |
| WO | WO 2006/030544 A1 | 3/2006 |

OTHER PUBLICATIONS

The family of JP 2011-217175 cited herein includes: U.S. Pat. No. 8,289,309 B2.
The family of JP 2008-216960 cited herein includes: US Patent Application Publication No. US 2008/0211744 A1 EP Patent No. 1 965 371 A2.
The family of JP 2008-216961 cited herein includes: EP Patent No. 1 965 370 A2 U.S. Pat. No. 8,416,157 B2.
The family of JP 2004-29791 cited herein includes: U.S. Pat. No. 7,109,952 B2.

* cited by examiner

SEMICONDUCTOR DEVICE

This application is a continuation of copending U.S. application Ser. No. 15/464,689, filed on Mar. 21, 2017 which is a continuation of U.S. application Ser. No. 14/713,941, filed on May 15, 2015 (now U.S. Pat. No. 9,608,010 issued Mar. 28, 2017) which is a continuation of U.S. application Ser. No. 13/775,854, filed on Feb. 25, 2013 (now U.S. Pat. No. 9,036,766 issued May 19, 2015), which are all incorporated herein by reference.

BACKGROUND OF THE INVENTION

1. Field of the Invention

One example of the present invention relates to a semiconductor device, a display device, and the like.

2. Description of the Related Art

A shift register circuit formed using transistors having the same polarity has been actively developed these days (see Patent Document 1). The shift register circuit of Patent Document 1 uses n-channel transistors and, when a clock signal is brought into a high level, outputs the clock signal, thereby outputting high-level signals sequentially. However, because the shift register circuit of Patent Document 1 outputs a clock signal, low-level signals cannot be output sequentially.

Further, in the case where the shift register circuit of Patent Document 1 uses p-channel transistors, although low-level signals can be output sequentially, high-level signals cannot be output sequentially.

REFERENCE

Patent Document

[Patent Document 1] Japanese Published Patent Application No. 2004-103226

SUMMARY OF THE INVENTION

However, a shift register circuit using n-channel transistors is required to output low-level signals sequentially. Further, a shift register circuit using p-channel transistors is required to output high-level signals sequentially.

In view of the above, it is an object of an implementation of the present invention to provide a circuit for sequentially outputting low-level signals, whose transistors are n-channel type. Another object of an implementation of the present invention is to provide a circuit for sequentially outputting high-level signals, whose transistors are p-channel type. Another object of an implementation of the present invention is to reduce the circuit scale. Still another object of an implementation of the present invention is to reduce power consumption.

An implementation of the present invention is a semiconductor device which includes a first transistor including a source and a drain, one of which is electrically connected to a first wiring and the other of which is electrically connected to a second wiring; a second transistor including a source and a drain, one of which is electrically connected to a third wiring and the other of which is electrically connected to the second wiring; a third transistor including a source and a drain, one of which is electrically connected to a fourth wiring and the other of which is electrically connected to a gate of the second transistor; a fourth transistor including a source and a drain, one of which is electrically connected to a fifth wiring and the other of which is electrically connected to a gate of the third transistor, and also including a gate electrically connected to a sixth wiring; and a first switch including a first terminal electrically connected to the third wiring and a second terminal electrically connected to a gate of the first transistor.

The above implementation of the present invention may include a second switch including a first terminal electrically connected to the first wiring and a second terminal electrically connected to the gate of the first transistor.

The above implementation of the present invention may include a third switch including a first terminal electrically connected to the third wiring and a second terminal electrically connected to the gate of the second transistor.

In the above implementation of the present invention, the first to fourth transistors may include an oxide semiconductor in their channel formation regions.

With an implementation of the present invention, a circuit for sequentially outputting low-level signals, whose transistors are n-channel type, can be provided. Further, with an implementation of the present invention, a circuit for sequentially outputting high-level signals, whose transistors are p-channel type, can be provided. Furthermore, with an implementation of the present invention, the circuit scale can be reduced. Moreover, with an implementation of the present invention, power consumption can be reduced.

DETAILED DESCRIPTION OF THE INVENTION

Figure 1A:
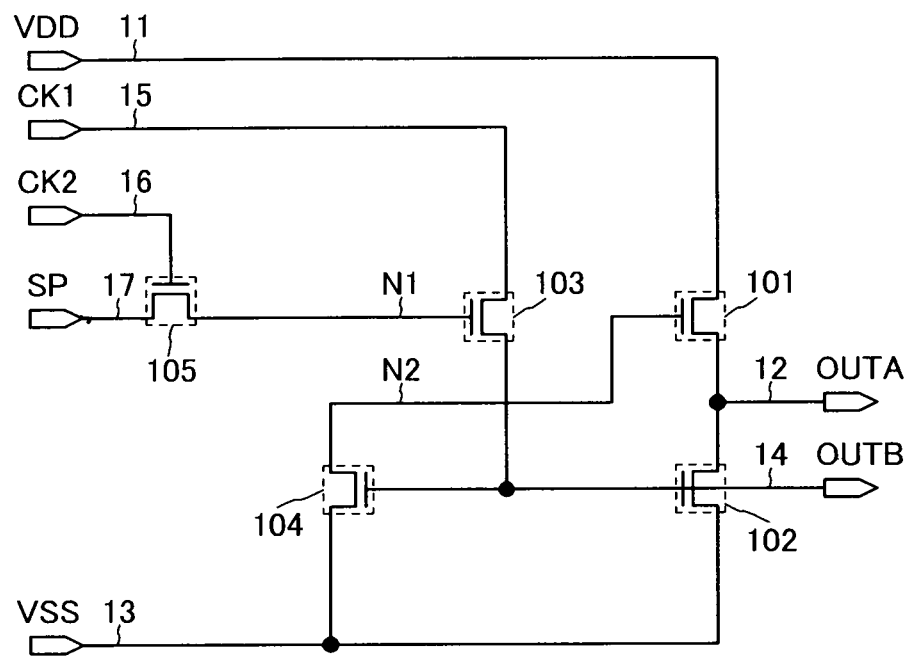
FIGS. 1A and 1B are diagrams for explaining a basic circuit according to the present invention.

Implementations of the present invention will be described below with reference to the drawings. Note that the present invention can be implemented in various different modes, and it will be readily appreciated by those skilled in the art that modes and details of the present invention can be modified in various ways without departing from the spirit and scope of the present invention. The present invention therefore should not be construed as being limited to the description of the implementations. Note that in structures of the present invention described below, reference numerals denoting the same portions are used in common in different drawings.

Note that the size, the thickness of a layer, signal waveform, and a region in structures illustrated in the drawings and the like in the implementations are exaggerated for simplicity in some cases. Therefore, the scale is not necessarily limited to that illustrated in the drawings and the like.

Note that, in this specification, the terms "first", "second", "third", to "N-th" (N is a natural number) are used in order to avoid confusion between components, and thus do not limit the components numerically.

Implementation 1

In this implementation, a basic circuit, a sequential circuit, and a shift register circuit according to one implementation of the present invention will be described.

First, a basic circuit (also referred to as a semiconductor device or a driver circuit) of this implementation will be described.

FIG. 1A is a circuit diagram of the basic circuit of this implementation. The basic circuit in FIG. 1A includes transistors 101 to 105.

Note that in one implementation of the present invention, the polarity of the transistors may be either n-channel type or p-channel type, but it is preferable that the transistors 101 to 105 have the same polarity. Description of this implementation will be made on the assumption that the transistors 101 to 105 are n-channel transistors.

In one implementation of the present invention, as the transistors, transistors including a semiconductor such as silicon or germanium in their channel formation regions can be used. Further, transistors including a semiconductor such as an oxide semiconductor or a nitride semiconductor in their channel formation regions can be used as the transistors. Note that the above-described semiconductors include an amorphous, microcrystalline, polycrystalline, or single-crystal region.

In one implementation of the present invention, thin film transistors (TFTs) can be used as the transistors. Further, MOS transistors, junction transistors, bipolar transistors, or the like formed using a semiconductor substrate or an SOI substrate can be used as the transistors.

Next, connection relations of the basic circuit in FIG. 1A will be described.

A first terminal (also referred to as "one of a source and a drain") of the transistor 101 is connected to a wiring 11, and a second terminal (also referred to as "the other of the source and the drain") of the transistor 101 is connected to a wiring 12. A first terminal of the transistor 102 is connected to a wiring 13, a second terminal of the transistor 102 is connected to the wiring 12, and a gate of the transistor 102 is connected to a wiring 14. A first terminal of the transistor 103 is connected to a wiring 15, and a second terminal of the transistor 103 is connected to the wiring 14. A first terminal of the transistor 104 is connected to the wiring 13, a second terminal of the transistor 104 is connected to a gate of the transistor 101, and a gate of the transistor 104 is connected to the wiring 14. A first terminal of the transistor 105 is connected to a wiring 17, a second terminal of the transistor 105 is connected to a gate of the transistor 103, and a gate of the transistor 105 is connected to a wiring 16.

Note that a node N1 denotes a connection portion of the gate of the transistor 103 and the second terminal of the transistor 105. Further, a node N2 denotes a connection portion of the gate of the transistor 101 and the second terminal of the transistor 104.

Note that in this specification and the like, the term "being connected" means "being electrically connected" and corresponds to a state in which current, voltage, a potential, a signal, charge, or the like can be supplied or transmitted. The state of "being connected" therefore means not only a state of direct connection but also a state of indirect connection through an element such as a wiring, a conductive film, a resistor, a diode, a transistor, or a switching element, for example.

Next, signals, potentials, and the like of the wirings 11 to 17 will be described.

A potential VDD is supplied to the wiring 11. A signal OUTA is output from the wiring 12. A potential VSS is supplied to the wiring 13. A signal OUTB is output from the wiring 14. A signal CK1 is input to the wiring 15. A signal CK2 is input to the wiring 16. A signal SP is input to the wiring 17.

Note that the potential VDD and the potential VSS are constant potentials. The potential VDD is higher than the potential VSS.

Note that the signal OUTA, the signal OUTB, the signal CK1, the signal CK2, and the signal SP are digital signals having a high level and a low level.

The signals, potentials, and the like of the wirings 11 to 17 are not limited to those described above. At least a signal, potential, or the like for increasing the potential of the wiring 12 is supplied to the wiring 11. At least a signal, potential, or the like for decreasing the potential of the wiring 12 and/or a signal, potential, or the like for turning off the transistor 101 are supplied to the wiring 13. At least a signal, potential, or the like for increasing the potential of the wiring 14, a signal, potential, or the like for turning on the transistor 102, and/or a signal, potential, or the like for turning on the transistor 104 are supplied to the wiring 15. At least a signal for controlling on/off of the transistor 105 is input to the wiring 16. At least a signal, potential, or the like for turning on the transistor 103 is input to the wiring 17.

In this specification and the like, a wiring to which a signal is input may be referred to as a signal line. In addition, a wiring to which a potential is supplied may be referred to as a power supply line.

In one implementation of the present invention, a wiring has a function of transmitting a signal, potential, or the like. For example, the wiring 15 has a function of transmitting the signal CK1.

Next, an operation of the basic circuit of FIG. 1A will be described.

Figure 1B:
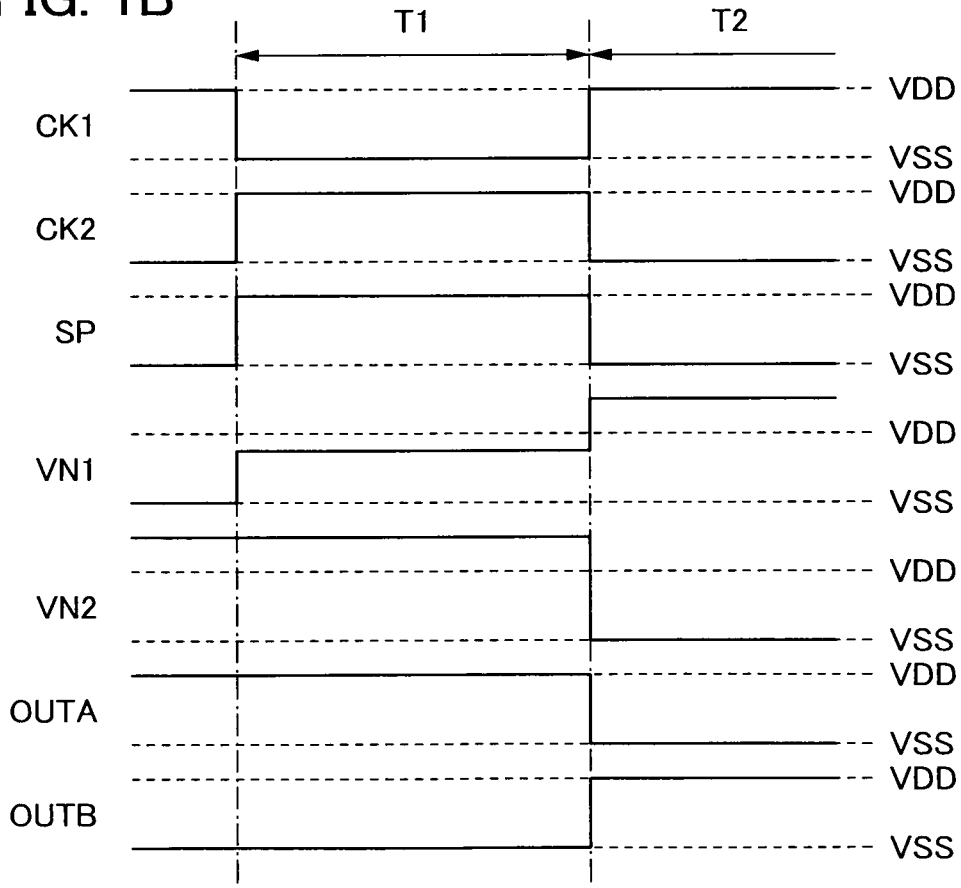

FIG. 1B is a timing chart for explaining the operation of the basic circuit of FIG. 1A. The timing chart in FIG. 1B shows the signal CK1, the signal CK2, the signal SP, the potential of the node N1 (VN1), the potential of the node N2 (VN2), the signal OUTA, and the signal OUTB.

For convenience's sake, description will be made on the assumption that the high-level potential and the low-level potential of each of the signal SP, the signal CK1, and the signal CK2 are the potential VDD and the potential VSS respectively.

For convenience's sake, description will be made on the assumption that an initial value of the potential VN1 of the node N1 is the potential VSS and an initial value of the potential VN2 of the node N2 is a potential exceeding the sum of the potential VDD and the threshold voltage of the transistor 101.

For convenience's sake, a period T1 and a period T2 will be described separately.

In the period T1, the signal SP is brought into the high level, the signal CK1 is brought into the low level, and the signal CK2 is brought into the high level.

By turning on the transistor 105, the signal SP of the wiring 17 is supplied to the node N1. In the period T1, since the signal SP is at the high level, the potential of the node N1 increases. The transistor 105 is turned off when the potential of the node N1 reaches a potential obtained by subtracting the threshold voltage of the transistor 105 from the gate potential (e.g., potential VDD) of the transistor 105, whereby the node N1 is brought into a floating state.

By turning on the transistor 103, the signal CK1 is supplied to the wiring 14. In the period T1, since the signal CK1 is at the low level, the potential of the wiring 14 is the potential VSS. Consequently, the signal OUTB is at the low level.

Since the transistor 104 is turned off, the node N2 is brought into a floating state. Accordingly, the potential of the node N2 is kept at the potential exceeding the sum of the potential VDD and the threshold voltage of the transistor 101.

By turning on the transistor 101 and turning off the transistor 102, the potential VDD of the wiring 11 is supplied to the wiring 12; thus, the wiring 12 has the potential VDD. Consequently, the signal OUTA is at the high level.

In the period T2, the signal SP is brought into the low level, the signal CK1 is brought into the high level, and the signal CK2 is brought into the low level.

By turning off the transistor 105, the node N1 is brought into a floating state.

Since the transistor 103 is on, the signal CK1 of the wiring 15 is supplied to the wiring 14. In the period T2, since the signal CK1 is at the high level, the potential of the wiring 14 increases. At this time, the node N1 is in the floating state, and a difference in potential between the node N1 and the wiring 14 is maintained at the transistor 103. Accordingly, in accordance with the increase in the potential of the wiring 14, the potential of the node N1 also increases. When the potential of the node N1 becomes a potential exceeding the sum of the potential of the first terminal of the transistor 103 (e.g., potential VDD) and the threshold voltage of the transistor 103, the potential of the wiring 14 becomes the potential VDD. In other words, the signal OUTB is brought into the high level.

By turning on the transistor 104, the potential VSS of the wiring 13 is supplied to the node N2. Accordingly, the potential of the node N2 becomes the potential VSS.

The transistor 101 is turned off and the transistor 102 is turned on, whereby the potential VSS of the wiring 13 is supplied to the wiring 12; thus, the wiring 12 has the potential VSS. Consequently, the signal OUTA is at the low level.

In the above-described manner, the signal OUTA is at the high level in the period T1 and at the low level in the period T2. In addition, the signal OUTB is at the low level in the period T1 and at the high level in the period T2.

Next, a sequential circuit using the basic circuit illustrated in FIG. 1A will be described.

Figure 2A:
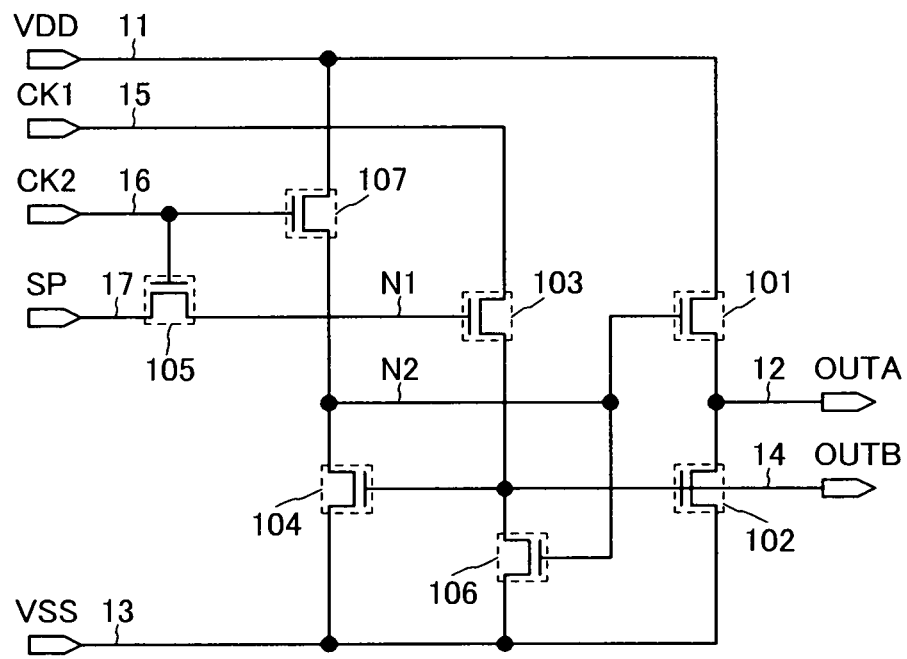
FIGS. 2A and 2B are diagrams for explaining a sequential circuit according to the present invention.

FIG. 2A is a circuit diagram of a sequential circuit according to this implementation. The sequential circuit in FIG. 2A includes transistors 101 to 107.

Note that it is preferable that the transistor 106 and the transistor 107 have the same polarity as the transistor 101. In this implementation, description will be made on the assumption that the transistor 106 and the transistor 107 are n-channel transistors.

The transistor 106 is not necessarily provided for the sequential circuit of FIG. 2A. Alternatively, the transistor 107 is not necessarily provided for the sequential circuit of FIG. 2A.

Next, connection relations of the sequential circuit in FIG. 2A will be described.

Since the connection relations of the transistors 101 to 105 are the same as those of the basic circuit in FIG. 1A, the description thereof is omitted. A first terminal of the transistor 106 is connected to the wiring 13, a second terminal of the transistor 106 is connected to the wiring 14, and a gate of the transistor 106 is connected to the node N2. A first terminal of the transistor 107 is connected to the wiring 11, a second terminal of the transistor 107 is connected to the node N2, and a gate of the transistor 107 is connected to the wiring 16.

Next, an operation of the sequential circuit in FIG. 2A will be described.

Figure 2B:
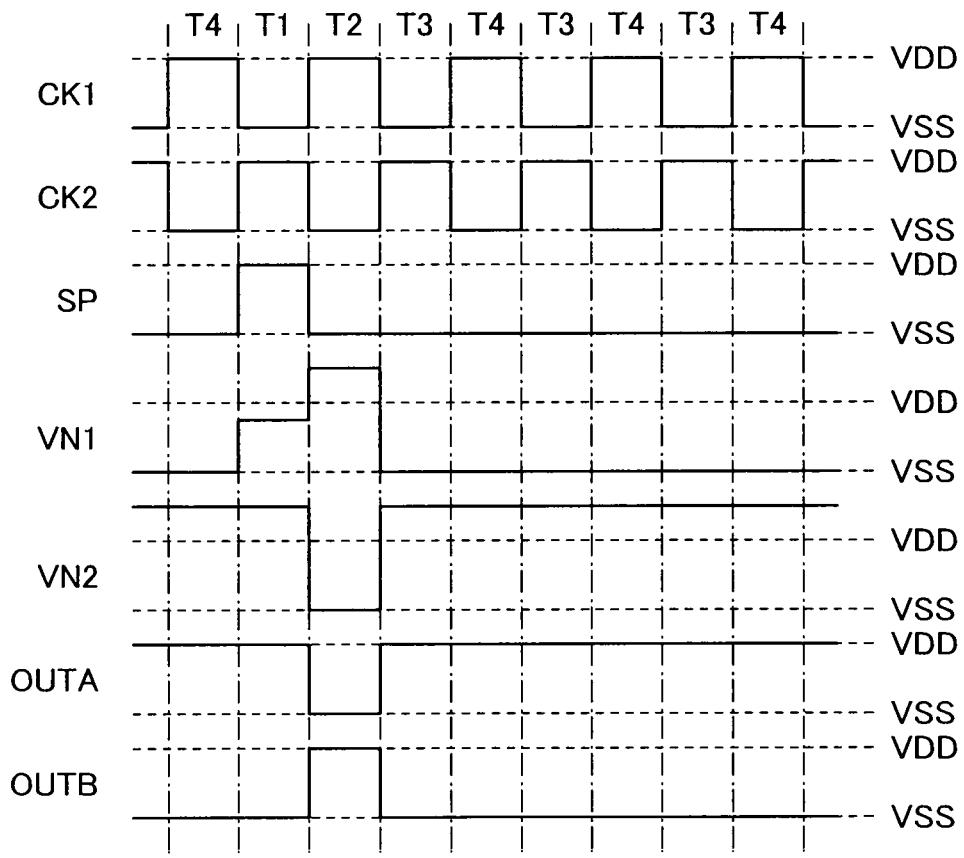

FIG. 2B is a timing chart for explaining the operation of the sequential circuit of FIG. 2A. The timing chart in FIG. 2B shows the signal CK1, the signal CK2, the signal SP, the potential of the node N1 (VN1), the potential of the node N2 (VN2), the signal OUTA, and the signal OUTB.

For convenience's sake, description will be made on the assumption that high-level potential and low-level potential of each of the signal SP, the signal CK1, and the signal CK2 are the potential VDD and the potential VSS respectively.

For convenience's sake, description will be made on the assumption that an initial value of the potential VN1 of the node N1 is the potential VSS and an initial value of the potential VN2 of the node N2 is a potential exceeding the sum of the potential VDD and the threshold voltage of the transistor 101.

For convenience's sake, a period T1, a period T2, a period T3, and a period T4 will be described separately.

In the period T1, the signal SP is brought into the high level, the signal CK1 is brought into the low level, and the signal CK2 is brought into the high level.

By turning on the transistor 105, the signal SP of the wiring 17 is supplied to the node N1. In the period T1, since the signal SP is at the high level, the potential of the node N1 increases. The transistor 105 is turned off when the potential of the node N1 reaches a potential obtained by subtracting the threshold voltage of the transistor 105 from the gate potential (e.g., potential VDD) of the transistor 105, whereby the node N1 is brought into a floating state.

The transistor 103 is turned on and the transistor 106 is also turned on, whereby the signal CK1 of the wiring 15 and the potential VSS of the wiring 13 are supplied to the wiring 14. In the period T1, since the signal CK1 is at the low level, the potential of the wiring 14 is the potential VSS. Consequently, the signal OUTB is at the low level.

The transistor 107 is off and the transistor 104 is off; accordingly, the node N2 is brought into a floating state. Thus, the potential of the node N2 is kept at the potential exceeding the sum of the potential of the first terminal of the transistor 101 (e.g., potential VDD) and the threshold voltage of the transistor 101.

Note that in the case where the initial value of the potential VN2 of the node N2 is the potential VSS, the transistor 107 is turned on and the potential VDD of the wiring 11 is supplied to the node N2.

The transistor 101 is turned on and the transistor 102 is turned off, whereby the potential VDD of the wiring 11 is supplied to the wiring 12. Accordingly, the wiring 12 has the potential VDD. Consequently, the signal OUTA is at the high level.

In the period T2, the signal SP is brought into the low level, the signal CK1 is brought into the high level, and the signal CK2 is brought into the low level.

By turning off the transistor 105, the node N1 is brought into a floating state.

Since the transistor 103 is on and the transistor 106 is turned off, the signal CK1 of the wiring 15 is supplied to the wiring 14. In the period T2, since the signal CK1 is at the high level, the potential of the wiring 14 increases. At this time, the node N1 is in the floating state, and a difference in potential between the node N1 and the wiring 14 is maintained between the gate of the transistor 103 and the second terminal of the transistor 103. Accordingly, in accordance with the increase in the potential of the wiring 14, the potential of the node N1 also increases. When the potential of the node N1 reaches a potential exceeding the sum of the potential of the first terminal of the transistor 103 (e.g., potential VDD) and the threshold voltage of the transistor 103, the potential of the wiring 14 becomes the potential VDD. In other words, the signal OUTB is brought into the high level.

The transistor 107 is off and the transistor 104 is on, whereby the potential VSS of the wiring 13 is supplied to the node N2. Accordingly, the potential of the node N2 becomes the potential VSS.

The transistor 101 is off and the transistor 102 is on, whereby the potential VSS of the wiring 13 is supplied to the wiring 12; thus, the wiring 12 has the potential VSS. Consequently, the signal OUTA is at the low level.

In the period T3, the signal SP is at the low level, the signal CK1 is brought into the low level, and the signal CK2 is brought into the high level.

By turning on the transistor 105, the signal SP of the wiring 17 is supplied to the node N1. In the period T3, since the signal SP is at the low level, the potential of the node N1 is the potential VSS.

The transistor 103 is off and the transistor 106 is on, whereby the potential VSS of the wiring 13 is supplied to the wiring 14; thus, the wiring 14 has the potential VSS. Consequently, the signal OUTB is at the low level.

The transistor 107 is on and the transistor 104 is off, whereby the potential VDD of the wiring 11 is supplied to the node N2, which increases the potential of the node N2. The transistor 107 is turned off when the potential of the node N2 reaches a potential obtained by subtracting the threshold voltage of the transistor 107 from the gate potential (e.g., potential VDD) of the transistor 107, whereby the node N2 is brought into a floating state.

Since the transistor 101 is on and the transistor 102 is off, the potential VDD of the wiring 11 is supplied to the wiring 12. Accordingly, the potential of the wiring 12 increases. At this time, the node N2 is in the floating state, and a difference in potential between the node N2 and the wiring 12 is maintained between the gate of the transistor 101 and the second terminal of the transistor 101. Accordingly, in accordance with the increase in the potential of the wiring 12, the potential of the node N2 also increases. When the potential of the node N2 reaches a potential exceeding the sum of the potential of the first terminal of the transistor 101 (e.g., potential VDD) and the threshold voltage of the transistor 101, the potential of the wiring 12 becomes the potential VDD. In other words, the signal OUTA is brought into the high level.

In the period T4, the signal SP is at the low level, the signal CK1 is brought into the high level, and the signal CK2 is brought into the low level.

By turning off the transistor 105, the node N1 is brought into a floating state. Accordingly, the potential of the node N1 is kept at the potential in the period T3.

The transistor 103 is off and the transistor 106 is on, whereby the potential VSS of the wiring 13 is supplied to the wiring 14; thus, the wiring 14 has the potential VSS. Consequently, the signal OUTB is at the low level.

The transistor 107 is off and the transistor 104 is off; accordingly, the node N2 is brought into a floating state. Thus, the potential of the node N2 is kept at the potential in the period T3.

By turning on the transistor 101 and turning off the transistor 102, the potential VDD of the wiring 11 is supplied to the wiring 12; thus, the wiring 12 has the potential VDD. Consequently, the signal OUTA is at the high level.

In the above-described manner, the signal OUTA is at the low level in the period T2 and at the high level in the period T1, the period T3, and the period T4. In addition, the signal OUTB is at the high level in the period T2 and at the low level in the period T1, the period T3, and the period T4.

Next, a shift register circuit using the sequential circuit illustrated in FIG. 2A will be described.

Figure 3:
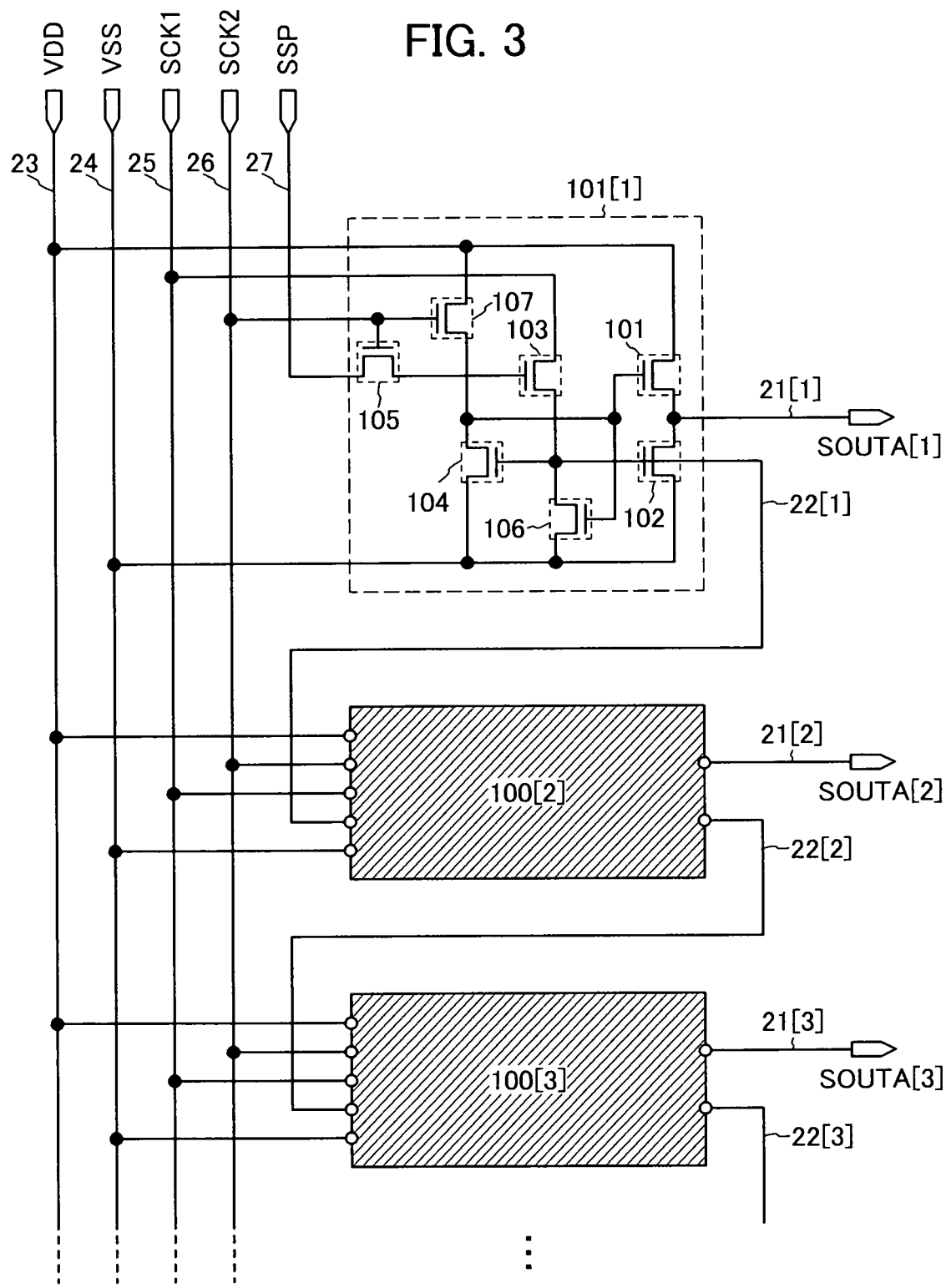
FIG. 3 is a diagram for explaining a shift register circuit according to the present invention.

FIG. 3 is a circuit diagram of a shift register circuit according to this implementation. The shift register circuit in FIG. 3 includes N (stages of) sequential circuits 100 (N is a natural number). In FIG. 3, only the first-stage to third-stage sequential circuits (the sequential circuit 100[1], the sequential circuit 100[2], the sequential circuit 100[3]) are illustrated.

As each of the N sequential circuits 100, the sequential circuit in FIG. 2A is used.

Next, connection relations of the shift register circuit in FIG. 3 will be described.

The shift register circuit in FIG. 3 is connected to N wirings 21, N wirings 22, a wiring 23, a wiring 24, a wiring 25, a wiring 26, and a wiring 27.

Specifically, in the i-th-stage (i is any one of 2 to N) sequential circuit 100 (referred to as sequential circuit 100[i]), the second terminal of the transistor 101 is connected to the wiring 21[i]. The gate of the transistor 102 is connected to the wiring 22[i]. The first terminal of the transistor 105 is connected to the wiring 22[i−1]. The first terminal of the transistor 101 is connected to the wiring 23. The first terminal of the transistor 102 is connected to the wiring 24. The first terminal of the transistor 103 is connected to one of the wiring 25 and the wiring 26. The gate of the transistor 107 is connected to the other of the wiring 25 and the wiring 26.

That is, in the sequential circuit 100[i], the wiring 21[i] corresponds to the wiring 12. The wiring 22[i] corresponds to the wiring 14. The wiring 23 corresponds to the wiring 11. The wiring 24 corresponds to the wiring 13. One of the wiring 25 and the wiring 26 corresponds to the wiring 15. The other of the wiring 25 and the wiring 26 corresponds to the wiring 16. The wiring 22[i−1] corresponds to the wiring 17.

In the sequential circuit 100[i−1] or the sequential circuit 100[i+1], the first terminal of the transistor 103 is connected to the other of the wiring 25 and the wiring 26. The gate of the transistor 107 is connected to one of the wiring 25 and the wiring 26. In other words, the wiring to which the first terminal of the transistor 103 is connected and the wiring to which the gate of the transistor 107 is connected are changed between the odd-numbered stage and the even-numbered stage.

The sequential circuit 100[1] is different from the i-th-stage sequential circuit 100 in that the first terminal of the transistor 105 is connected to the wiring 27.

Next, signals, potentials, and the like of the wirings 21 to 27 will be described.

A signal SOUTA is output from the wiring 21. A signal SOUTB is output from the wiring 22. A potential VDD is supplied to the wiring 23. A potential VSS is supplied to the wiring 24. A signal SCK1 is input to the wiring 25. A signal SCK2 is input to the wiring 26. A signal SSP is input to the wiring 27.

Note that the signal SOUTA corresponds to the signal OUTA. The signal SOUTB corresponds to the signal OUTB. The signal SCK1 corresponds to the signal CK1 or the signal CK2. The signal SCK2 corresponds to the signal CK1 or the signal CK2. The signal SSP corresponds to the signal SP.

Figure 4:
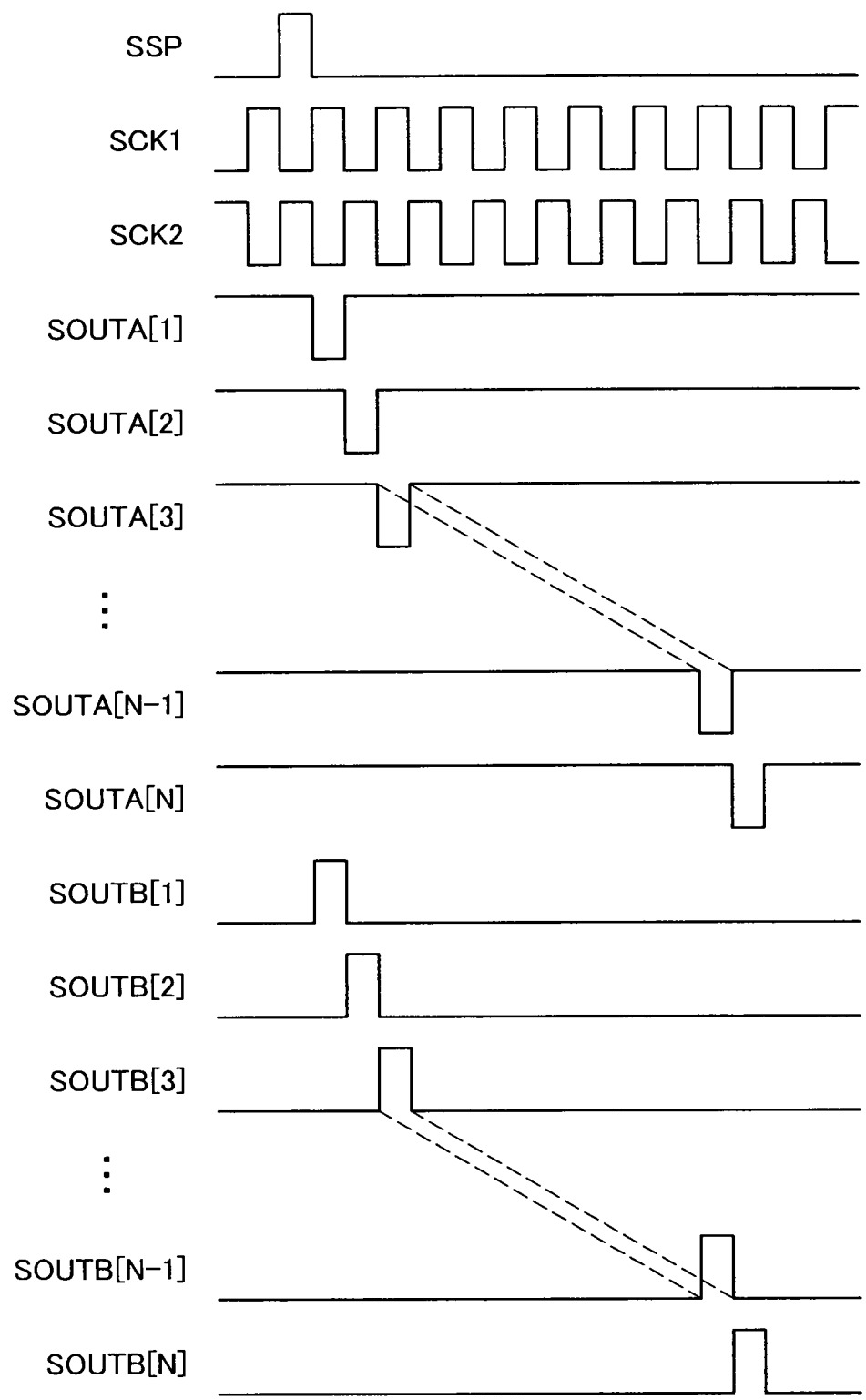
FIG. 4 is a diagram for explaining a shift register circuit according to the present invention.

Next, an operation of the shift register circuit in FIG. 3 will be described FIG. 4 is a timing chart for explaining the operation of the shift register circuit of FIG. 3. The timing chart in FIG. 4 shows the signal SSP, the signal SCK1, the signal SCK2, the signals SOUTA[1] to SOUTA[3], the signal SOUTA[N−1], the signal SOUTA[N], the signals SOUTB[1] to SOUTB[3], the signal SOUTB[N−1], and the signal SOUTB[N].

When the signal SOUTB[i−1] is brought into the high level, the sequential circuit 100[*i*] starts the operation of the period T1. Accordingly, the signal SOUTA[i] is brought into the high level and the signal SOUTB[i] is brought into the low level.

When the signal SCK1 and the signal SCK2 are inverted afterwards, the sequential circuit 100[*i*] starts the operation of the period T2. Accordingly, the signal SOUTA[i] is brought into the low level and the signal SOUTB[i] is brought into the high level.

Then, until the signal SOUTB[i−1] is brought into the high level again, every time the signal SCK1 and the signal SCK2 are inverted, the sequential circuit 100[*i*] alternately performs the operation of the period T3 and the operation of the period T4. Accordingly, the signal SOUTA[i] is at the high level, and the signal SOUTB[i] is at the low level.

The sequential circuit 100[1] is different from the sequential circuit 100[*i*] in that the operation of the period T1 is started when the signal SSP is brought into the high level.

In the above-described manner, after the signal SSP is brought into the high level, the signal SOUTA[1] to the signal SOUTA[N] are sequentially brought into the low level. In addition, after the signal SSP is brought into the high level, the signal SOUTB[1] to the signal SOUTB[N] are sequentially brought into the high level.

Next, functions of the transistors 101 to 107 will be described.

Each of the transistors 101 to 107 has a function of controlling conduction/non-conduction between a portion to which the first terminal is connected and a portion to which the second terminal is connected. Further, each of the transistors 101 to 107 has a function of supplying a signal, a potential, or the like of the portion to which the first terminal is connected to the portion to which the second terminal is connected. For example, the transistor 102 has a function of controlling conduction/non-conduction between the wiring 13 and the wiring 12 and a function of supplying the potential VSS to the wiring 12.

The transistor 101 and the transistor 103 have a function of maintaining a difference in potential between a portion to which the gate is connected and the portion to which the second terminal is connected. For example, the transistor 101 has a function of maintaining a difference in potential between the node N2 and the wiring 12.

The transistor 105 and the transistor 107 have a function of electrically disconnecting the portion to which the first terminal is connected from the portion to which the second terminal is connected after electrically connecting the portion to which the first terminal is connected to the portion to which the second terminal is connected. Further, the transistor 105 and the transistor 107 have a function of stopping the supply of a signal, a potential, or the like of the portion to which the first terminal is connected after supplying a signal, a potential, or the like of the portion to which the first terminal is connected to the portion to which the second terminal is connected. For example, the transistor 105 has a function of electrically disconnecting the wiring 17 from the node N1 after electrically connecting the wiring 17 to the node N1 and a function of stopping the supply of the signal SP after supplying the signal SP to the node N1.

The transistor 101 has a function of supplying a signal, a potential, or the like for increasing the potential to the wiring 12. The transistor 102 has a function of supplying a signal, a potential, or the like for decreasing the potential to the wiring 12. The transistor 103 has a function of supplying a signal, a potential, or the like for increasing the potential to the wiring 14. The transistor 104 has a function of supplying a signal, a potential, or the like for turning off the transistor 101 to the node N2. The transistor 105 has a function of supplying a signal, a potential, or the like for turning on the transistor 103 to the node N1. The transistor 106 has a function of supplying a signal, a potential, or the like for decreasing the potential to the wiring 14. The transistor 107 has a function of supplying a signal, a potential, or the like for turning on the transistor 101 to the node N2.

In one implementation of the present invention, the transistors may be replaced by switches having a function of controlling conduction/non-conduction between the first terminal and the second terminal. The first terminal of the transistor corresponds to the first terminal of the switch, and the second terminal of the transistor corresponds to the second terminal of the switch. If necessary, the gate of the transistor corresponds to a control terminal of the switch.

Next, W/L (W: channel width, L: channel length) of the transistors 101 to 107 will be described.

It is preferable that W/L of the transistor 101 be larger than W/L of the transistors 102 to 107. In addition, it is preferable that W/L of the transistor 102 be larger than W/L of the transistor 104. Further, it is preferable that W/L of the transistor 103 be larger than W/L of the transistor 105. Furthermore, it is preferable that W/L of the transistor 104 be larger than W/L of the transistor 106.

Incidentally, in the case where p-channel transistors are used as the transistors 101 to 107, it is preferable that the potential VSS be supplied to the wiring 11 and the potential VDD be supplied to the wiring 13. Further, it is preferable that the signal CK1, the signal CK2, and the signal SP be inverted, which also makes the signal OUTA and the signal OUTB inverted. In the case where p-channel transistors are used as the transistors 101 to 107, "increase" and "decrease" in the above description are replaced by "decrease" and "increase" respectively.

Next, effects of the basic circuit, the sequential circuit, and the shift register circuit according to this implementation will be described.

In the circuit whose transistors are n-channel type only, the low-level signal can be shifted. In the circuit whose transistors are p-channel type only, the high-level signal can be shifted.

With a small number of transistors, signals such as the signal OUTA and the signal SOUTA can be generated.

Further, a period in which both the transistor 107 and the transistor 104 are on can be eliminated, whereby a current generated between the wiring 11 and the wiring 13 can be small. Thus, power consumption can be reduced.

Furthermore, a period in which both the transistor 101 and the transistor 102 are on can be eliminated, whereby a current generated between the wiring 11 and the wiring 13 can be small. Thus, power consumption can be reduced.

In the period in which the signal CK1 is at the high level, the period in which both the transistor 103 and the transistor 106 are on can be eliminated, whereby a current generated between the wiring 15 and the wiring 13 can be small. Thus, power consumption can be reduced.

In the period T3, due to the transistor 105 being on, the signal SP at the low level can be supplied to the node N1. This can make it easy to keep the potential of the node N1 at the potential VSS and prevent malfunctions.

Further in the period T3, due to the transistor 107 being on, the potential VDD can be supplied to the node N2. This can make it easy to keep the potential of the node N2 at a high potential and prevent malfunctions.

Further in the period T3 and the period T4, due to the transistor 106 being on, the potential VSS of the wiring 13 can be supplied to the wiring 14. This can make it easy to keep the potential of the wiring 14 at the potential VSS and prevent malfunctions.

This implementation can be implemented in appropriate combination with any of the other implementations and the like.

Implementation 2

In this implementation, a basic circuit, a sequential circuit, and a shift register circuit which are different from those in Implementation 1 will be described. Note that components in common with those in Implementation 1 are denoted by common reference numerals, and description thereof is omitted.

In this implementation, the basic circuit, the sequential circuit, and the shift register circuit of this implementation will be described using the drawings of sequential circuits having modified structures of the sequential circuit in FIG. 2A. Note that the structures described in this implementation can be applied to not only the sequential circuit in FIG. 2A but also the basic circuit, sequential circuit, and shift register circuit described in Implementation 1.

The basic circuit, the sequential circuit, and the shift register circuit of this implementation have effects similar to those described in Implementation 1.

First, connection relations of the transistor 105 which is different from that in Implementation 1 will be described.

The first terminal of the transistor 105 may be connected to the wiring 11, the wiring 12, the wiring 16, the wiring 17, or the node N2; the second terminal of the transistor 105 may be connected to the node N1; and the gate of the transistor 105 may be connected to the wiring 17.

Figure 5A:
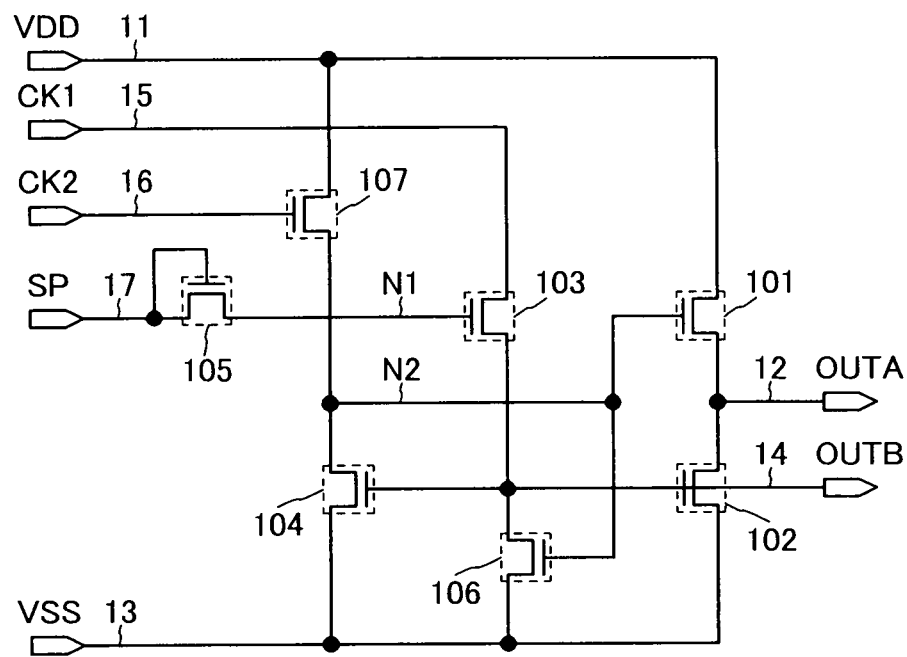
FIGS. 5A and 5B are diagrams for explaining sequential circuits according to the present invention.

FIG. 5A is a circuit diagram of a sequential circuit in which the first terminal of the transistor 105 is connected to the wiring 17, the second terminal of the transistor 105 is connected to the node N1, and the gate of the transistor 105 is connected to the wiring 17.

Next, connection relations of the transistor 107 which is different from that in Implementation 1 will be described.

The first terminal of the transistor 107 may be connected to the wiring 16, the second terminal of the transistor 107 may be connected to the node N2, and the gate of the transistor 107 may be connected to the wiring 16. Alternatively, the first terminal of the transistor 107 may be connected to the wiring 11, the second terminal of the transistor 107 may be connected to the node N2, and the gate of the transistor 107 may be connected to the wiring 11.

Figure 5B:
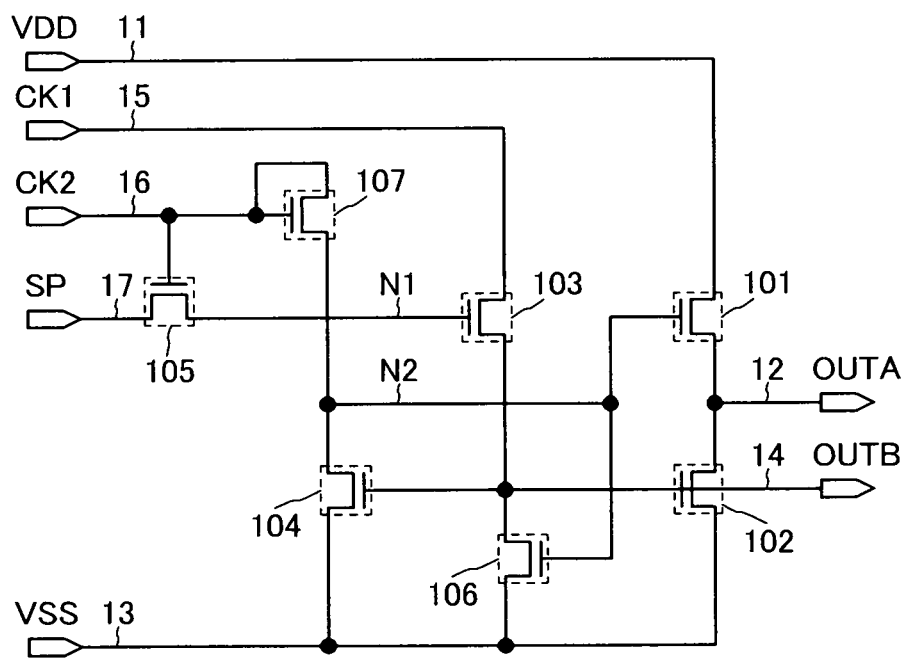

FIG. 5B is a circuit diagram of a sequential circuit in which the first terminal of the transistor 107 is connected to the wiring 16, the second terminal of the transistor 107 is connected to the node N2, and the gate of the transistor 107 is connected to the wiring 16.

Next, connection relations of the transistor 104 which is different from that in Implementation 1 will be described.

The first terminal of the transistor 104 may be connected to the wiring 13, the second terminal of the transistor 104 may be connected to the node N2, and the gate of the transistor 104 may be connected to the node N1 or the wiring 17.

Figure 6A:
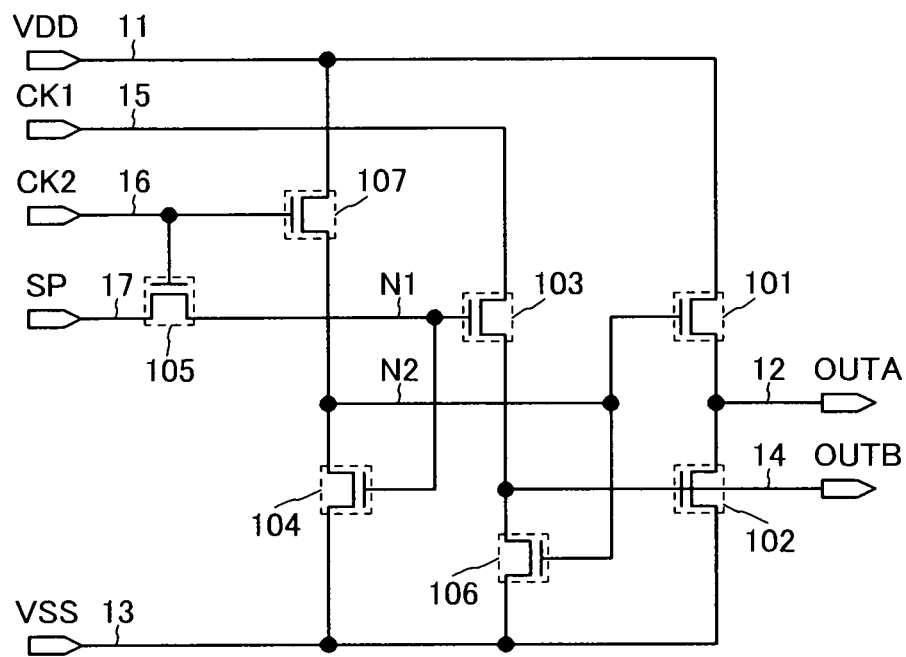
FIGS. 6A and 6B are diagrams for explaining sequential circuits according to the present invention.

FIG. 6A is a circuit diagram of a sequential circuit in which the first terminal of the transistor 104 is connected to the wiring 13, the second terminal of the transistor 104 is connected to the node N2, and the gate of the transistor 104 is connected to the node N1.

Next, connection relations of the transistor 102 which is different from that in Implementation 1 will be described.

The first terminal of the transistor 102 may be connected to the wiring 13, the second terminal of the transistor 102 may be connected to the wiring 12, and the gate of the transistor 102 may be connected to the node N1 or the wiring 17.

Figure 6B:
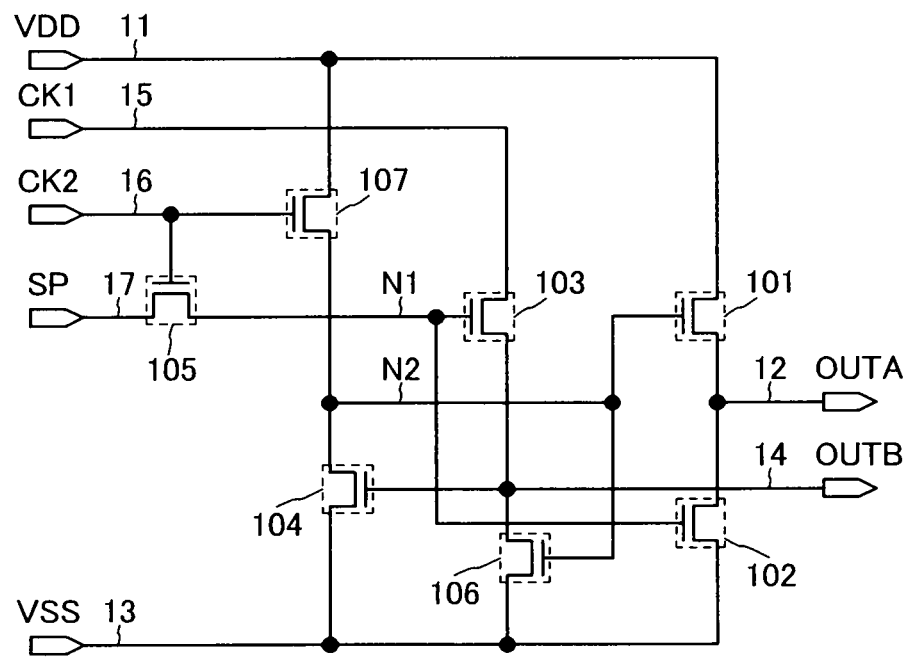

FIG. 6B is a circuit diagram of a sequential circuit in which the first terminal of the transistor 102 is connected to the wiring 13, the second terminal of the transistor 102 is connected to the wiring 12, and the gate of the transistor 102 is connected to the node N1.

Next, a connection relation of the transistor 106 which is different from that in Implementation 1 will be described.

The first terminal of the transistor 106 may be connected to the wiring 13, the second terminal of the transistor 106 may be connected to the wiring 14, and the gate of the transistor 106 may be connected to the wiring 16. With this connection relation, the time for turning on the transistor 106 can be shortened, and the potential VSS of the wiring 13 can be supplied to the wiring 14 in the period T3, whereby the potential of the wiring 14 can be kept stably.

Figure 7A:
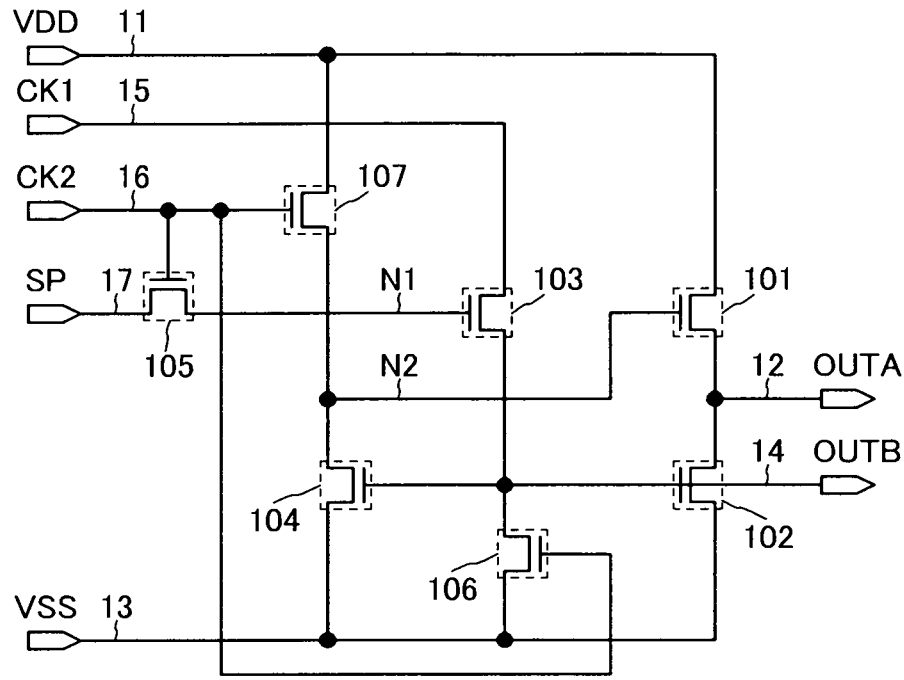
FIGS. 7A and 7B are diagrams for explaining sequential circuits according to the present invention.

FIG. 7A is a circuit diagram of a sequential circuit in which the first terminal of the transistor 106 is connected to the wiring 13, the second terminal of the transistor 106 is connected to the wiring 14, and the gate of the transistor 106 is connected to the wiring 16.

Next, a structure provided with a transistor 201, a transistor 202, a transistor 203, and a transistor 204 will be described.

Figure 7B:
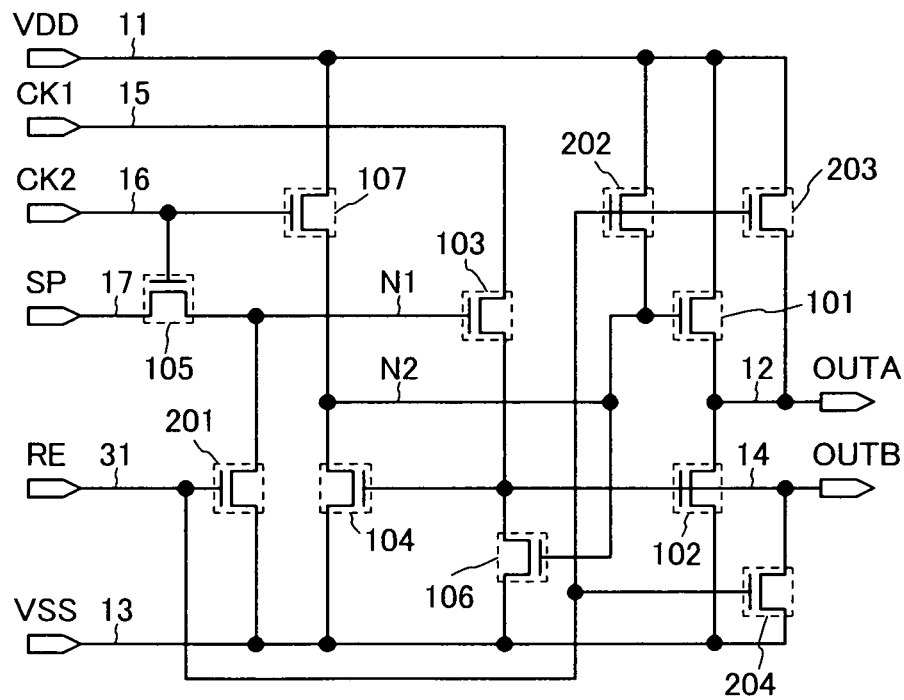

FIG. 7B is a circuit diagram of a sequential circuit provided with the transistor 201, the transistor 202, the transistor 203, and the transistor 204. A first terminal of the transistor 201 is connected to the wiring 13, a second terminal of the transistor 201 is connected to the node N1, and a gate of the transistor 201 is connected to a wiring 31. A first terminal of the transistor 202 is connected to the wiring 11, a second terminal of the transistor 202 is connected to the node N2, and a gate of the transistor 202 is connected to the wiring 31. A first terminal of the transistor 203 is connected to the wiring 11, a second terminal of the transistor 203 is connected to the wiring 12, and a gate of the transistor 203 is connected to the wiring 31. A first terminal of the transistor 204 is connected to the wiring 13, a second terminal of the transistor 204 is connected to the wiring 14, and a gate of the transistor 204 is connected to the wiring 31.

A signal RE is input to the wiring 31. The signal RE is a digital signal having a high level and a low level. Note that a signal input to the wiring 31 may be another signal as long as it is a signal for controlling conduction/non-conduction of the transistors 201 to 204.

Note that in the sequential circuit 100[*i*], the wiring 31 corresponds to a wiring 22[*i*+1]. Note that the wiring 31 may correspond to a wiring 22[*i*+*n*] (n is a natural number) such as a wiring 22[*i*+2] or a wiring 22[*i*+3].

When the signal RE is brought into the high level, the transistors 201 to 204 are turned on. By turning on the transistors 201 and 204, the potential VSS of the wiring 13 is supplied to the node N1 and the wiring 14. Accordingly, the potentials of the node N1 and the wiring 14 become the potential VSS. By turning on the transistors 202 and 203, the potential VDD of the wiring 11 is supplied to the node N2 and the wiring 12. Accordingly, the potentials of the node N2 and the wiring 12 become the potential VDD or a potential higher than the potential VSS.

On the other hand, when the signal RE is brought into the low level, the transistors 201 to 204 are turned off.

An example of the timing of the signal RE will be described. In the case where the wiring 31 corresponds to the wiring 22[*i*+1], the signal RE corresponds to a signal OUTB [*i*+1]. Accordingly, the signal RE is at the high level after the period T2 (e.g., in the period T3 right after the period T2) and at the low level in the other periods. Thus, the sequential circuit can be initialized after the period T2.

Note that only one, two, or three of the transistors 201 to 204 may be provided.

Next, a structure provided with a transistor 205, a transistor 206, a transistor 207, and a transistor 208 will be described.

Figure 8A:
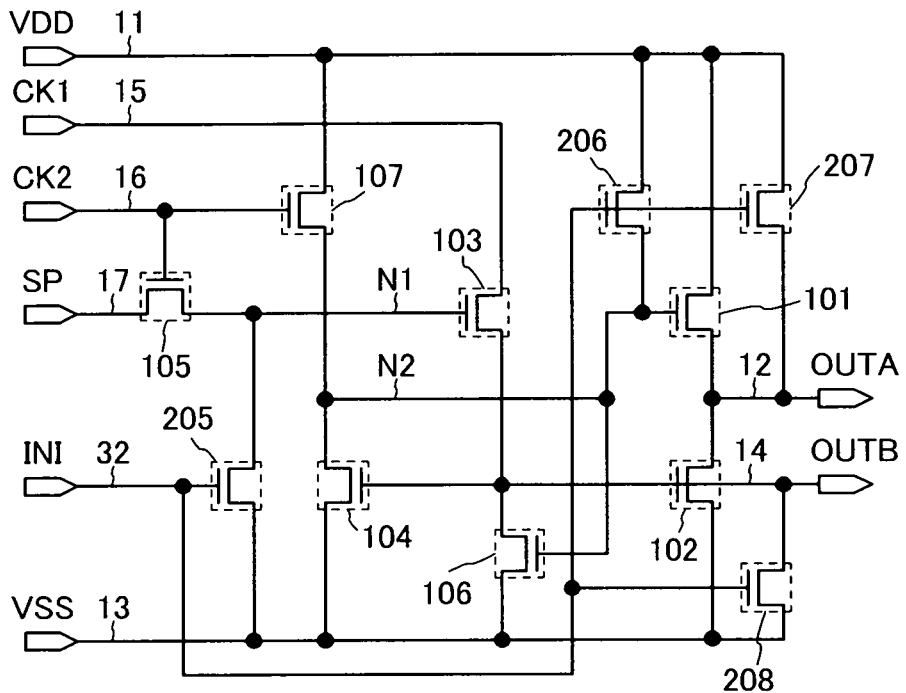
FIGS. 8A and 8B are diagrams for explaining sequential circuits according to the present invention.

FIG. 8A is a circuit diagram of a sequential circuit provided with the transistor 205, the transistor 206, the transistor 207, and the transistor 208. Connection relations of the transistors 205 to 208 are different from those of the transistors 201 to 204 in that gates are connected to the wiring 32.

Note that the gates of the transistors 205 to 208 of all or at least two of the N sequential circuits 100 are connected to a common portion.

A signal INI is input to the wiring 32. The signal INI is a digital signal having a high level and a low level. Note that a signal input to the wiring 32 may be another signal as long as it is a signal for controlling conduction/non-conduction of the transistors 205 to 208.

When the signal INI is brought into the high level, the transistors 205 to 208 are turned on. By turning on the transistors 205 and 208, the potential VSS of the wiring 13 is supplied to the node N1 and the wiring 14. Accordingly, the potentials of the node N1 and the wiring 14 become the potential VSS. By turning on the transistors 206 and 207, the potential VDD of the wiring 11 is supplied to the node N2 and the wiring 12. Accordingly, the potentials of the node N2 and the wiring 12 become the potential VDD or a potential higher than the potential VSS.

On the other hand, when the signal INI is brought into the low level, the transistors 205 to 208 are turned off.

An example of the timing of the signal INI will be described. The signal INI is brought into the high level before the period in which the signal SSP is at the high level. Thus, each of the sequential circuits 100 can be initialized before the first-stage sequential circuit 100 starts operation in the period T1. This contributes to the prevention of malfunctions.

Note that it is preferable that the signal INI be brought into the high level after the signal OUTB[N] is brought into the high level and before the signal SSP is brought into the high level. In addition, the signal INI may be brought into the high level after the power supply is started and before the signal SSP is brought into the high level.

Note that the first terminal of the transistor 207 may be connected to the wiring 13.

Note that the gates of the transistors 205 to 208 may be connected to the wiring 27. That is, the signal SSP may be used as the signal INT.

Note that only one, two, or three of the transistors 205 to 208 may be provided.

Next, a structure provided with a transistor 209 and a transistor 210 will be described.

Figure 8B:
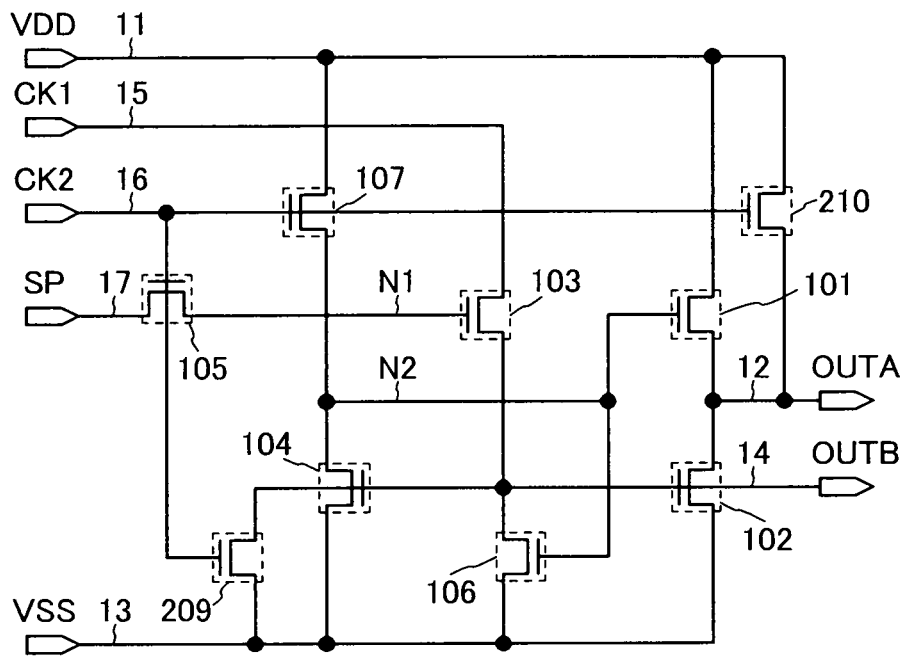

FIG. 8B is a circuit diagram of a sequential circuit provided with the transistor 209 and the transistor 210. A first terminal of the transistor 209 is connected to the wiring 13, a second terminal of the transistor 209 is connected to the wiring 14, and a gate of the transistor 209 is connected to the wiring 16. A first terminal of the transistor 210 is connected to the wiring 11, a second terminal of the transistor 210 is connected to the wiring 12, and a gate of the transistor 210 is connected to the wiring 16.

When the signal CK2 is brought into the high level, the transistor 209 and the transistor 210 are turned on. By turning on the transistor 209, the potential VSS of the wiring 13 is supplied to the wiring 14. By turning on the transistor 210, the potential VDD of the wiring 11 is supplied to the wiring 12.

On the other hand, when the signal CK2 is brought into the low level, the transistor 209 and the transistor 210 are turned off.

The signal CK2 is at the high level in the period T1 and the period T3 and at the low level in the period T2 and the period T4. Accordingly, in the period T1 and the period T3, the potential VSS of the wiring 13 is supplied to the wiring 14 and the potential VDD of the wiring 11 is supplied to the wiring 12. In particular in the period T3, the signal CK2 at the high level enables the potential VSS of the wiring 13 to be regularly supplied to the wiring 14 and the potential VDD of the wiring 11 to be regularly supplied to the wiring 12. Thus, the potentials of the wiring 14 and the wiring 12 can be easily kept.

Note that only one of the transistors 209 and 210 may be provided.

Next, a structure provided with a transistor 211 and a transistor 212 will be described.

Figure 9A:
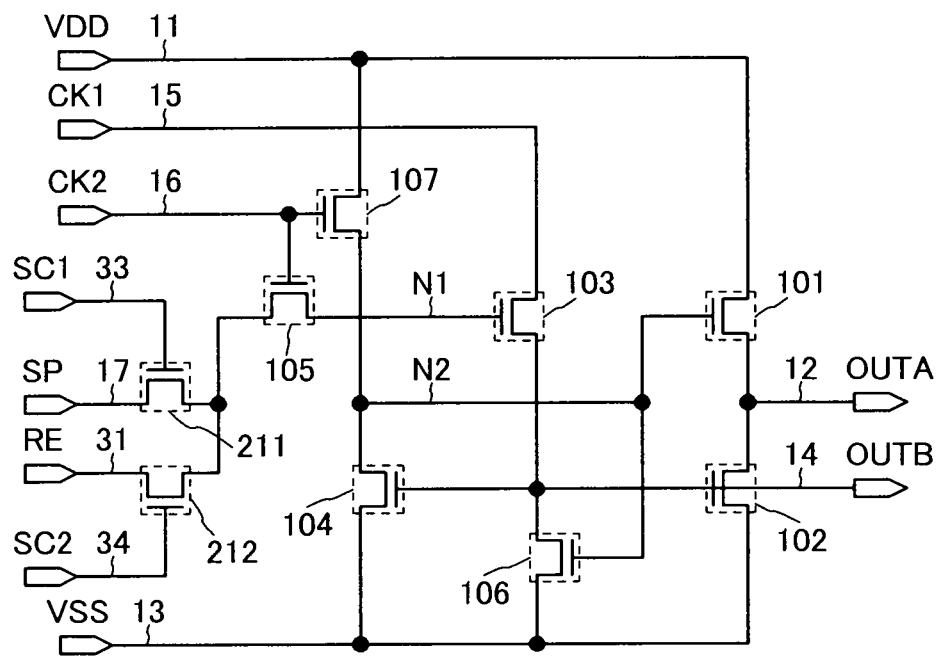
FIGS. 9A and 9B are diagrams for explaining sequential circuits according to the present invention.

FIG. 9A is a circuit diagram of a sequential circuit provided with the transistor 211 and the transistor 212. A first terminal of the transistor 211 is connected to the wiring 17, a second terminal of the transistor 211 is connected to the first terminal of the transistor 105, and a gate of the transistor 211 is connected to a wiring 33. A first terminal of the transistor 212 is connected to the wiring 31, a second terminal of the transistor 212 is connected to the first terminal of the transistor 105, and a gate of the transistor 212 is connected to a wiring 34.

Note that the gates of the transistors 211 of all or at least two of the N sequential circuits 100 are connected to a common portion, and the gates of the transistors 212 of all or at least two of the N sequential circuits 100 are connected to a common portion.

A signal SC1 is input to the wiring 33. The signal SC1 is a digital signal having a high level and a low level. Note that a signal input to the wiring 33 may be another signal as long as it is a signal for controlling conduction/non-conduction of the transistor 211. A signal SC2 is input to the wiring 34. The signal SC2 is a digital signal having a high level and a low level. Note that a signal input to the wiring 34 may be another signal as long as it is a signal for controlling conduction/non-conduction of the transistor 212.

When the signal SC1 is brought into the high level and the signal SC2 is brought into the low level, the transistor 211 is turned on and the transistor 212 is turned off. By turning on the transistor 211, the signal SP of the wiring 17 is supplied to the first terminal of the transistor 105.

On the other hand, when the signal SC1 is brought into the low level and the signal SC2 is brought into the high level, the transistor 211 is turned off and the transistor 212 is turned on. By turning on the transistor 212, the signal RE of the wiring 31 is supplied to the first terminal of the transistor 105.

An example of the timing of the signal SC1 and the signal SC2 will be described. In the case where the shift direction of the shift register circuit is in the direction from the sequential circuit 100[1] to the sequential circuit 100[N], the signal SC1 is at the high level and the signal SC2 is at the low level. In the case where the shift direction of the shift register circuit is in the direction from the sequential circuit 100[N] to the sequential circuit 100[1], the signal SC1 is at the low level and the signal SC2 is at the high level.

Next, a structure provided with a transistor 213 and a transistor 214 will be described.

Figure 9B:
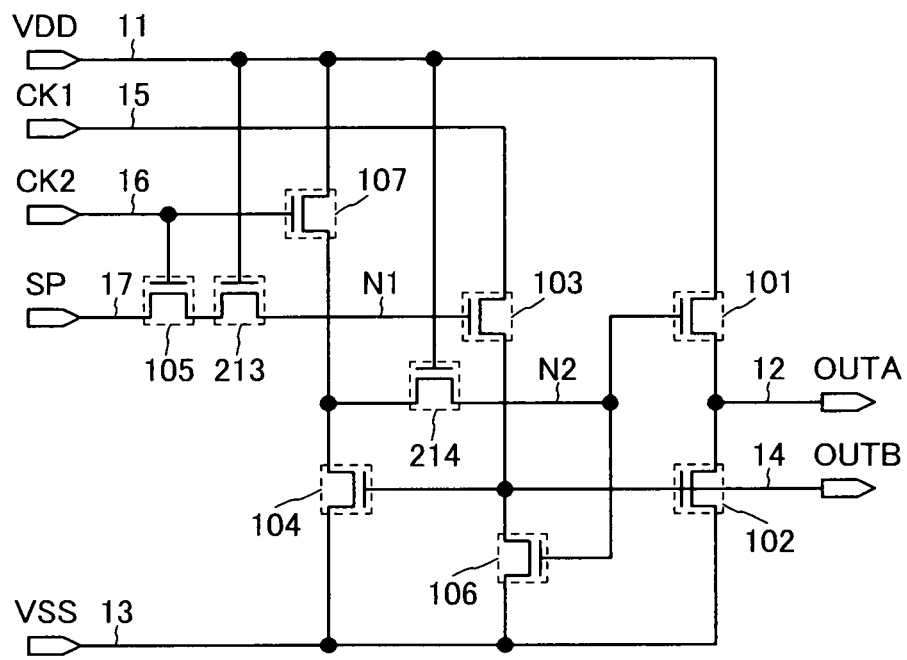

FIG. 9B is a circuit diagram of a sequential circuit provided with the transistor 213 and the transistor 214. A first terminal of the transistor 213 is connected to the second terminal of the transistor 105, a second terminal of the transistor 213 is connected to the gate of the transistor 103, and a gate of the transistor 213 is connected to the wiring 11. A first terminal of the transistor 214 is connected to the second terminal of the transistor 107, a second terminal of the transistor 214 is connected to the gate of the transistor 101, and a gate of the transistor 214 is connected to the wiring 11.

By including the transistor 213, an excessive increase in the potential of the gate of the transistor 103 can be prevented. Thus, deterioration of the transistor 103 can be suppressed, and the dielectric breakdown of the transistor 103 can be prevented.

By including the transistor 214, an excessive increase in the potential of the gate of the transistor 101 can be prevented. Thus, deterioration of the transistor 101 can be suppressed, and the dielectric breakdown of the transistor 101 can be prevented. Further, Vgs of the transistor 106 can be made low, whereby deterioration of the transistor 106 can be suppressed.

Note that the gate of the transistor 213 may be connected to the wiring 12, the wiring 16, the wiring 17, the gate of the transistor 101, or the like. Note that the first terminal of the transistor 213 may be connected to the wiring 17, and the second terminal of the transistor 213 may be connected to the first terminal of the transistor 105.

Note that the gate of the transistor 214 may be connected to the wiring 12, the wiring 16, or the like. Note that the first terminal of the transistor 214 may be connected to the wiring 11, and the second terminal of the transistor 214 may be connected to the first terminal of the transistor 107.

Note that the gate of the transistor 106 may be connected to the second terminal of the transistor 104.

Note that only one of the transistors 213 and 214 may be provided.

Next, a structure with some of the transistors replaced by switches will be described.

Figure 10A:
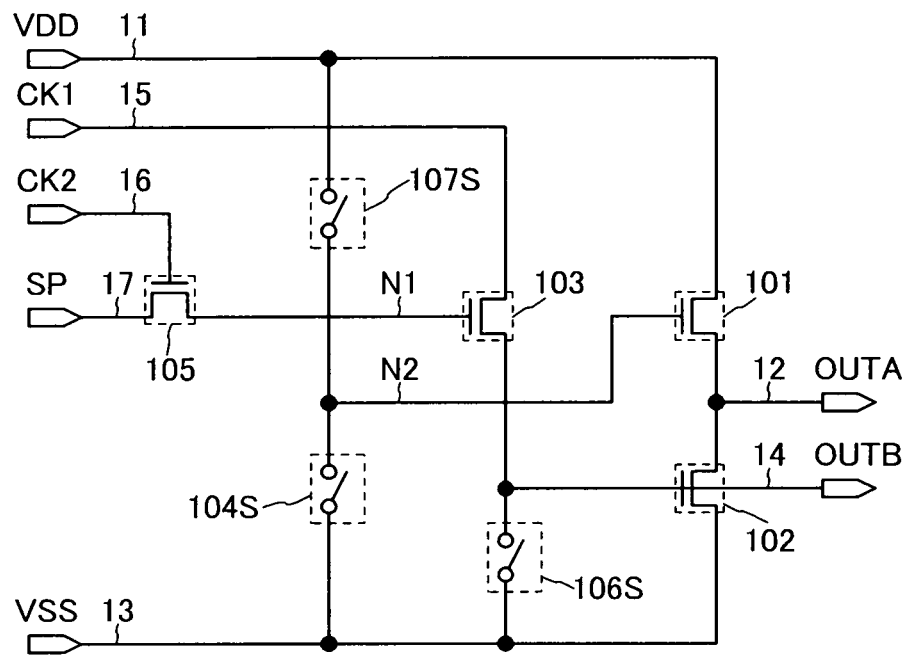
FIGS. 10A and 10B are diagrams for explaining a basic circuit and a sequential circuit according to the present invention.

FIG. 10A is a circuit diagram of a sequential circuit using switches as the transistor 104, the transistor 106, and the transistor 107. A switch 104S, a switch 106S, and a switch 107S correspond to the transistor 104, the transistor 106, and the transistor 107, respectively. A first terminal of the switch 104S is connected to the wiring 13, and a second terminal of the switch 104S is connected to the gate of the transistor 101. A first terminal of the switch 106S is connected to the wiring 13, and a second terminal of the switch 106S is connected to the wiring 14. A first terminal of the switch 107S is connected to the wiring 11, and a second terminal of the switch 107S is connected to the gate of the transistor 101.

In the period T1, the switch 104S is off, the switch 106S is on, and the switch 107S is on. In the period T2, the switch 104S is on, the switch 106S is off, and the switch 107S is off. In the period T3, the switch 104S is off, the switch 106S is on, and the switch 107S is on. In the period T4, the switch 104S is off, the switch 106S is on, and the switch 107S is off.

Note that the switch 104S may be on in the period T1. Further, the switch 106S may be off in either the period T3 or the period T4. Further, the switch 107S may be on in the period T4.

Figure 10B:
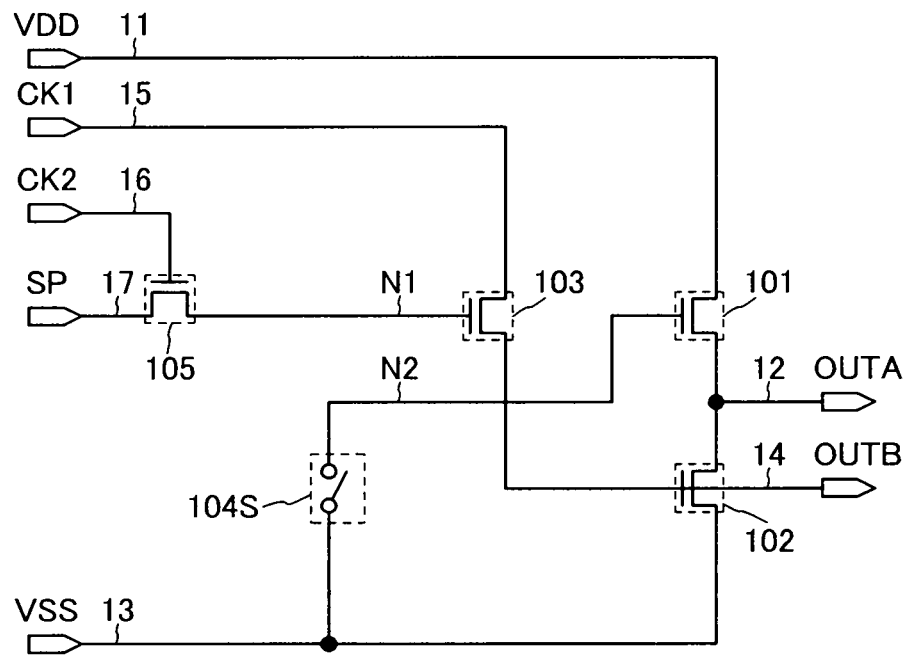
Figure 11A:
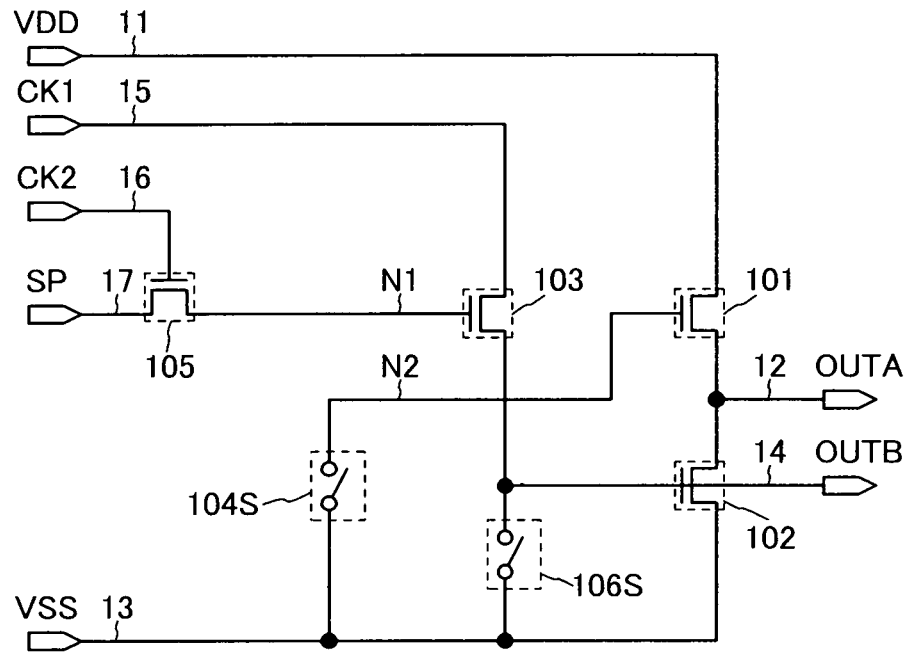
FIGS. 11A and 11B are diagrams for explaining basic circuits according to the present invention.
Figure 11B:
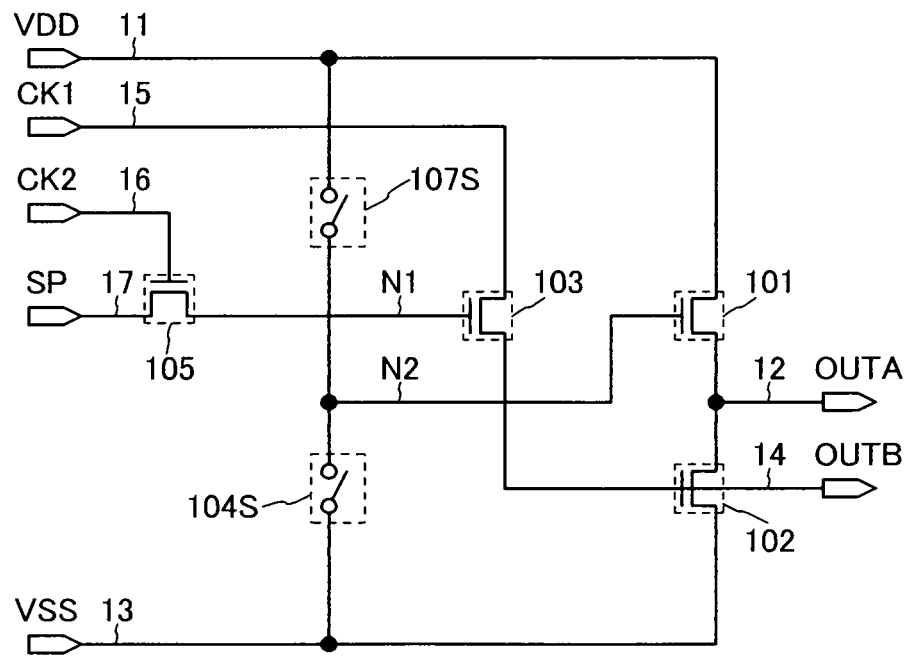

FIG. 10B is a circuit diagram of a basic circuit using the switch 104S as the transistor 104. FIG. 11A is a circuit diagram of a basic circuit formed by adding the switch 106S to the basic circuit in FIG. 10B. FIG. 11B is a circuit diagram of a basic circuit formed by adding the switch 107S to the basic circuit in FIG. 10B.

Next, functions of the transistors 201 to 214 will be described.

Each of the transistors 201 to 214 has a function of controlling conduction/non-conduction between a portion to which the first terminal is connected and a portion to which the second terminal is connected. Further, each of the transistors 201 to 214 has a function of supplying a signal, a potential, or the like of the portion to which the first terminal is connected to the portion to which the second terminal is connected. For example, the transistor 201 has a function of controlling conduction/non-conduction between the wiring 13 and the node N1 and a function of supplying the potential VSS to the node N1.

The transistor 213 and the transistor 214 have a function of electrically disconnecting the portion to which the first terminal is connected from the portion to which the second terminal is connected after electrically connecting the portion to which the first terminal is connected to the portion to which the second terminal is connected. Further, the transistor 213 and the transistor 214 have a function of stopping the supply of a signal, a potential, or the like of the portion to which the first terminal is connected after supplying a signal, a potential, or the like of the portion to which the first terminal is connected to the portion to which the second terminal is connected. For example, the transistor 213 has a function of electrically disconnecting the second terminal of the transistor 105 from the gate of the transistor 103 after electrically connecting the second terminal of the transistor 105 to the gate of the transistor 103 and a function of stopping the supply the potential of the second terminal of the transistor 105 after supplying the potential of the second terminal of the transistor 105 to the node N1.

The transistors 201 to 214 preferably have the same polarity as the transistor 101.

Further, W/L of the transistor 101 is preferably larger than W/L of the transistors 201 to 214.

This implementation can be implemented in appropriate combination with any of the other implementations and the like.

Implementation 3

In this implementation, a display device according to one implementation of the present invention will be described.

Figure 12A:
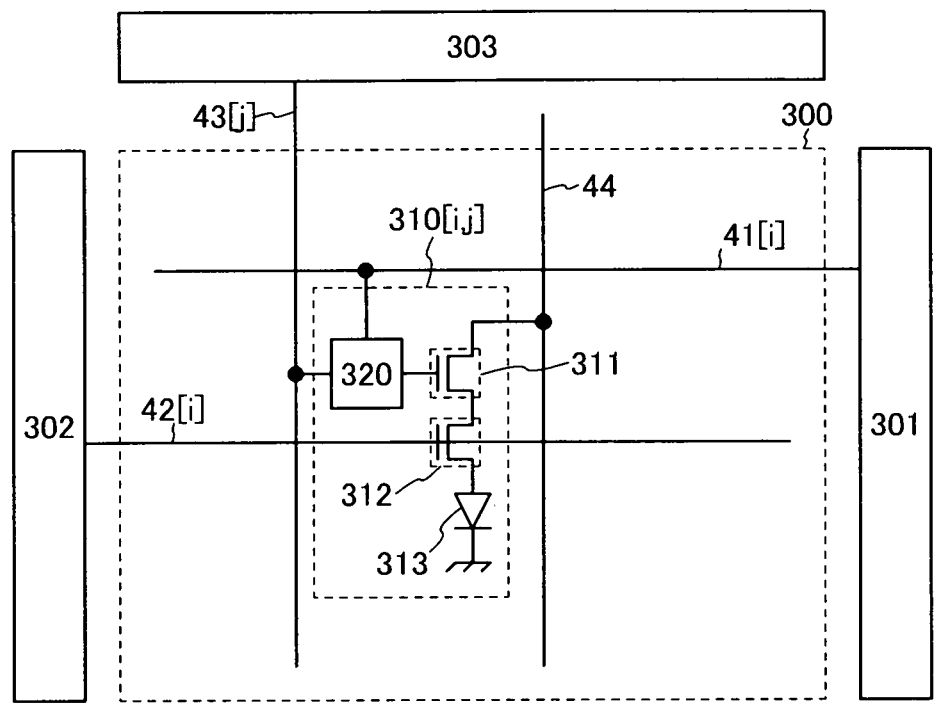
FIGS. 12A and 12B are diagrams for explaining a display device according to the present invention.

FIG. 12A is a circuit diagram of a display device according to this implementation. The display device in FIG. 12A includes a pixel portion 300, a gate driver 301, a gate driver 302, and a source driver 303. The pixel portion 300 includes a plurality of pixels 310. Each of the plurality of pixels 310 includes a transistor 311, a transistor 312, a display element 313, and a circuit 320. As the gate driver 302, a shift register circuit in Implementation 1 or Implementation 2 can be used.

In one implementation of the present invention, a liquid crystal element (also referred to as a liquid crystal display element) or a light-emitting element (also referred to as a light-emitting display element) can be used as the display element. A light-emitting element includes, in its scope, an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

Next, connection relations of the display device in FIG. 12A will be described.

The gate driver 301 is connected to N wirings 41. The gate driver 302 is connected to N wirings 42. The source driver 303 is connected to M (M is a natural number) wirings 43. Note that in FIG. 12A, only the i-th wiring 41 (referred to as wiring 41[$i$]) of the N wirings 41, the i-th wiring 42 (referred to as wiring 42[$i$]) of the N wirings 42, and the j-th (j is any one of 1 to M) wiring 43 (referred to as wiring 43[$j$]) of the M wirings 43 are illustrated.

A pixel in the i-th row and the j-th column (referred to as pixel 310[$i,j$]) of the plurality of pixels 310 is connected to the wiring 41[$i$], the wiring 42[$i$], the wiring 43[$j$], and a wiring 44.

In the pixel 310[$i,j$], a first terminal of the transistor 311 is connected to the wiring 44, and a gate of the transistor 311 is connected to the circuit 320. A first terminal of the transistor 312 is connected to a second terminal of the transistor 311, a second terminal of the transistor 312 is connected to the display element 313, and a gate of the transistor 312 is connected to the wiring 42[$i$]. In addition, the circuit 320 is connected to the wiring 43[$j$] and the wiring 41[$i$].

Note that voltage is input to the wiring 44. The wiring 44 has a function of supplying current flowing to the display element 313.

In the case where the shift register circuit in Implementation 1 or Implementation 2 is used as the gate driver 302, the N wirings 42 correspond to the N wirings 21. For example, the wiring 42[$i$] corresponds to the wiring 21[$i$].

Next, the operation of the display device in FIG. 12A will be described.

The gate driver 301 sequentially outputs a signal at the high level to the N wirings 41. The gate driver 302 sequentially outputs a signal at the low level to the N wirings 42. The source driver 303 outputs a video signal to the M wirings 43.

For example, when the gate driver 301 outputs a signal at the high level to the wiring 41[$i$], a video signal from the wiring 43[$j$] is written in the pixel 310[$i,j$]. This video signal is the one output to the wiring 43[$j$] from the source driver 303. Then, the pixel 310[$i,j$] holds the video signal until the gate driver 301 outputs a signal at the high level to the wiring 41[$i$] again; thus, display corresponding to the video signal is performed.

Specifically, when the gate driver 301 outputs a signal at the high level to the wiring 41[$i$], a video signal is input to the circuit 320. The circuit 320 corrects the video signal in accordance with the threshold voltage, mobility, and/or the like of the transistor 311 and supplies the corrected video signal to the gate of the transistor 311, whereby the transistor 311 can supply current corresponding to the corrected video signal. Note that an unintended amount of current tends to flow through the transistor 311 in a period in which the video signal is input to the circuit 320, a period in which the video signal is corrected by the circuit 320, an initialization period before the video signal is input to the circuit 320, and/or the like. If this current is supplied to the display element, color deviation or black blurring may be caused. To solve these problems, in the above-described periods, the gate driver 302 outputs a signal at the low level to the wiring 42[$i$] to turn off the transistor 312.

In the case of using the shift register circuit in Implementation 1 or Implementation 2 as the gate driver 302, signals that the gate driver 302 outputs to the wirings 42[1] to 42[N] correspond to the signals SOUTA[1] to SOUTA[N]. For example, a signal that the gate driver 302 outputs to the wiring 42[$i$] corresponds to the signal SOUTA[$i$].

Figure 12B:
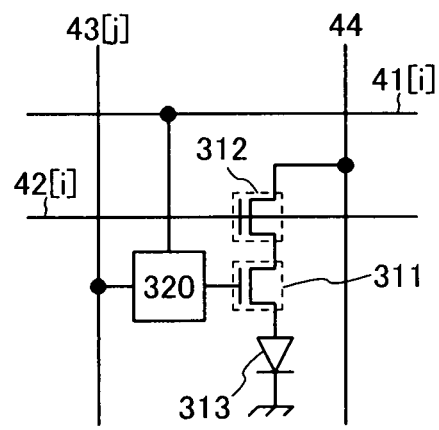

Note that as illustrated in FIG. 12B, the portion to which the transistor 311 is connected and the portion to which the transistor 312 is connected may be reversed.

By using the shift register circuit in Implementation 1 or Implementation 2 as the gate driver 302, the gate driver 302 can be formed using transistors having the same polarity as the transistors in the pixels. Accordingly, not only the gate driver 301 but also the gate driver 302 can be formed over the same substrate as the pixel portion 300.

This implementation can be implemented in appropriate combination with any of the other implementations and the like.

Implementation 4

Using an EL display device as an example, cross-sectional structures of a pixel and a driver circuit of a display device according to one implementation of the present invention will be described.

Figure 13:
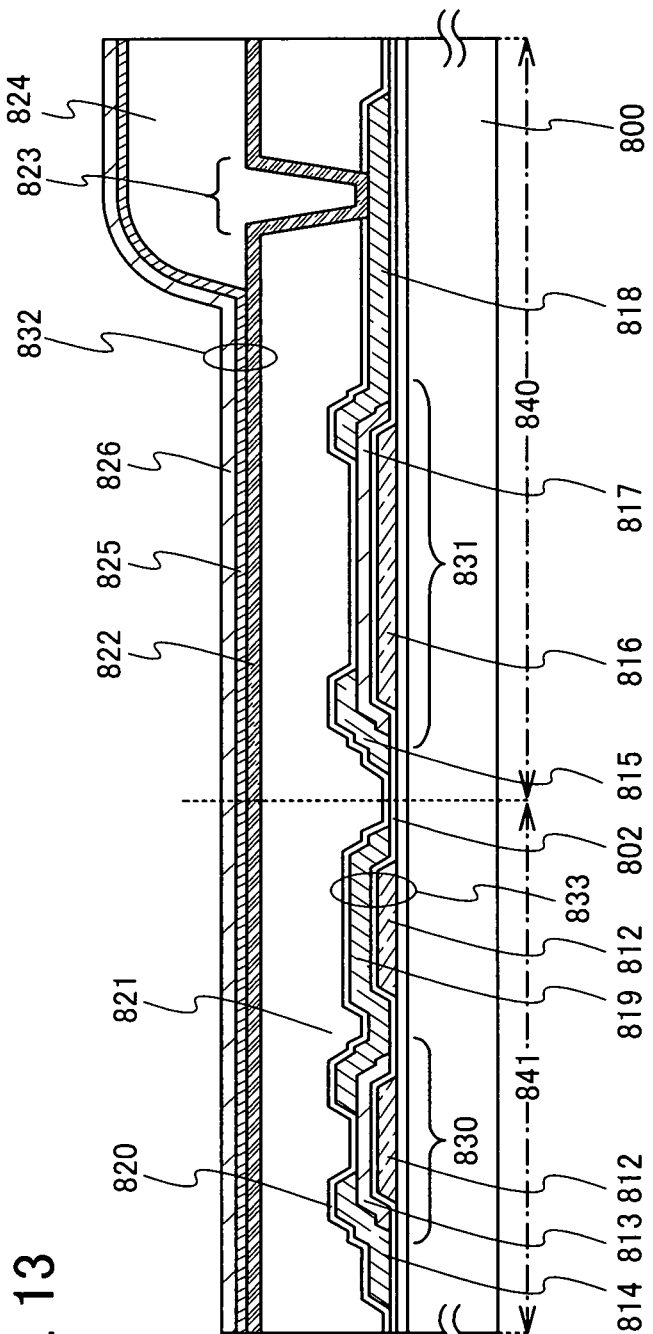
FIG. 13 is a diagram for explaining a display device according to the present invention.

FIG. 13 is a cross-sectional view of a display device of this implementation, showing a pixel 840 and a driver circuit 841.

The pixel 840 includes a light-emitting element 832 and a transistor 831 having a function of supplying current to the light-emitting element 832. In addition to the light-emitting element 832 and the transistor 831, the pixel 840 may also include a variety of semiconductor elements such as a transistor that controls input of an image signal to the pixel 840 and a capacitor that holds the potential of an image signal.

The driver circuit 841 includes a transistor 830 and a capacitor 833 that holds the gate voltage of the transistor 830. The driver circuit 841 corresponds to any of the basic circuits, the sequential circuits, and the shift register circuits described in Implementations 1 and 2. Specifically, the transistor 830 corresponds to the transistor 101, for example. The driver circuit 841 may also include a variety of semiconductor elements such as a transistor and a capacitor in addition to the transistor 830 and the capacitor 833.

The transistor 831 includes, over a substrate 800 having an insulating surface, a conductive film 816 functioning as a gate, a gate insulating film 802 over the conductive film 816, a semiconductor film 817 that overlaps the conductive film 816 with the gate insulating film 802 placed therebetween, and conductive films 815 and 818 that are positioned over the semiconductor film 817 and function as a source terminal and a drain terminal. The conductive film 816 also functions as a scan line.

The transistor 830 includes, over the substrate 800 having an insulating surface, a conductive film 812 functioning as a gate, the gate insulating film 802 over the conductive film 812, a semiconductor film 813 that overlaps the conductive film 812 with the gate insulating film 802 placed therebetween, and conductive films 814 and 819 that are positioned over the semiconductor film 813 and function as a source terminal and a drain terminal.

The capacitor 833 includes, over the substrate 800 having an insulating surface, the conductive film 812, the gate insulating film 802 over the conductive film 812, and the conductive film 819 that overlaps the conductive film 812 with the gate insulating film 802 placed therebetween.

An insulating film 820 and an insulating film 821 are stacked in this order over the conductive films 814, 815, 818, and 819. A conductive film 822 functioning as an anode is formed over the insulating film 821. The conductive film 822 is connected to the conductive film 818 through a contact hole 823 formed in the insulating films 820 and 821.

An insulating film 824 having an opening where part of the conductive film 822 is exposed is provided over the insulating film 821. An EL layer 825 and a conductive film 826 functioning as a cathode are stacked in this order over the part of the conductive film 822 and the insulating film 824. A region where the conductive film 822, the EL layer 825, and the conductive film 826 overlap one another corresponds to the light-emitting element 832.

In one implementation of the present invention, the transistors may include a semiconductor film containing an amorphous, microcrystalline, polycrystalline, or single crystal semiconductor (e.g., silicon or germanium), or a semiconductor film containing a wide bandgap semiconductor such as an oxide semiconductor.

When the semiconductor films of the transistors are formed using an amorphous, microcrystalline, polycrystalline, or single crystal semiconductor (e.g., silicon or germanium), impurity regions functioning as source and drain terminals are formed by addition of an impurity element imparting one conductivity to the semiconductor films. For example, an impurity region having n-type conductivity can be formed by addition of phosphorus or arsenic to the semiconductor film. Further, an impurity region having p-type conductivity can be formed by addition of boron, for example, to the semiconductor film.

In the case where an oxide semiconductor is used for the semiconductor films of the transistors, impurity regions functioning as source and drain terminals may be formed by addition of a dopant to the semiconductor films. The dopant can be added by ion implantation. Examples of the dopant are a rare gas such as helium, argon, and xenon; and a Group 15 element such as nitrogen, phosphorus, arsenic, and antimony. For example, when nitrogen is used as the dopant, the concentration of nitrogen atoms in the impurity region preferably ranges from $5\times10^{19}/cm^3$ to $1\times10^{22}/cm^3$.

As a silicon semiconductor, any of the following can be used, for example: amorphous silicon formed by sputtering or vapor phase growth such as plasma CVD, polycrystalline silicon obtained in such a manner that amorphous silicon is crystallized by laser annealing or the like, and single crystal silicon obtained in such a manner that a surface portion of a single crystal silicon wafer is separated after implantation of hydrogen ions or the like into the silicon wafer.

Note that an oxide semiconductor preferably contains at least indium (In) or zinc (Zn). In particular, In and Zn are preferably contained. In addition, as a stabilizer for reducing variation in electric characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may contain silicon.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. An In—Ga—Zn—O-based oxide has sufficiently high resistance when there is no electric field and can realize a sufficiently low off-state current. Moreover, the In—Ga—Zn—O-based oxide has high mobility and thus is a suitable semiconductor material for a transistor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, a high mobility can be obtained relatively easily in the case of using an In—Sn—Zn-based oxide. However, the mobility can be increased by reducing the defect density in the bulk also in the case of using an In—Ga—Zn-based oxide.

Note that a purified oxide semiconductor obtained by reduction of impurities serving as electron donors (donors), such as moisture or hydrogen, and by reduction of oxygen defects is an i-type (intrinsic) semiconductor or a substantially i-type semiconductor. A transistor including the purified oxide semiconductor therefore has extremely low off-state current. The bandgap of the oxide semiconductor is 2 eV or more, preferably 2.5 eV or more, further preferably 3 eV or more. With the use of an oxide semiconductor film that is highly purified by sufficient reduction in the concentration of impurities such as moisture and hydrogen and reduction of oxygen defects, the off-state current of a transistor can be decreased.

Specifically, various experiments can prove low off-state current of a transistor n which a purified oxide semiconductor is used for a semiconductor film. For example, the off-state current of even a transistor with a channel width of $1\times10^6$ μm and a channel length of 10 μm can be less than or equal to the measurement limit of a semiconductor parameter analyzer, that is, less than or equal to $1\times10^{-13}$ A when the voltage between a source terminal and a drain terminal (drain voltage) ranges from 1 V to 10 V. In this case, the off-state current density corresponding to a value obtained by dividing the off-state current by the channel width of the transistor is 100 zA/μm or less. In addition, the off-state current has been measured using a circuit in which a capacitor and a transistor were connected to each other and charge flowing into or from the capacitor was controlled by the transistor. For the measurement, the transistor in which a channel formation region is formed in a purified oxide semiconductor film has been used, and the off-state current density of the transistor has been measured from a change in the amount of charge of the capacitor per unit time. As a result, it has been proven that a lower off-state current density of several tens of yoctoamperes per micrometer (yA/μm) is obtained at a voltage between the source terminal and the drain terminal of the transistor of 3 V. Consequently, the off-state current of the transistor in which the channel formation region is formed in the purified oxide semiconductor film is significantly lower than that of a transistor using crystalline silicon.

Unless otherwise specified, in this specification, the off-state current of an n-channel transistor is a current which flows between a source terminal and a drain terminal at a gate potential of lower than or equal to zero with the potential of the source terminal considered as a reference potential, in the state where the potential of the drain terminal is higher than those of the source terminal and the gate. Moreover, the off-state current of a p-channel transistor is a current which flows between a source terminal and a drain terminal at a gate potential of higher than or equal to zero with the potential of the source terminal considered as a reference potential, in the state where the potential of the drain terminal is lower than those of the source terminal and the gate.

For example, the oxide semiconductor film can be formed by a sputtering method using a target including indium (In), gallium (Ga), and zinc (Zn). In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. A polycrystal or a c-axis aligned crystal (CAAC) that is later described is more likely to be formed by forming an oxide semiconductor film with use of a target of an In—Ga—Zn-based oxide having such an atomic ratio. Further, the filling rate of the target including In, Ga, and Zn is greater than or equal to 90% and less than or equal to 100%, preferably greater than or equal to 95% and less than 100%. The target with such a high filling rate enables a dense oxide semiconductor film to be formed.

In the case where an In—Zn-based oxide material is used for an oxide semiconductor film, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target that is used for forming an oxide semiconductor film containing an In—Zn-based oxide and has an atomic ratio of In:Zn:O=X:Y:Z, the relation of Z>1.5X+Y is satisfied. The mobility can be increased by keeping the ratio of Zn within the above range.

Specifically, the oxide semiconductor film may be formed as follows: the substrate is held in a treatment chamber kept at a reduced pressure, a sputtering gas from which hydrogen and moisture are removed is introduced while residual moisture in the treatment chamber is removed, and the above-described target is used. The substrate temperature during film formation may range from 100° C. to 600° C., preferably from 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom and a compound containing a hydrogen atom, such as water ($H_2O$) (preferably, a compound containing a carbon atom as well) are removed, whereby the impurity concentration in the oxide semiconductor film formed in the chamber can be reduced.

Note that the oxide semiconductor film formed by sputtering or the like sometimes contains a large amount of moisture or hydrogen (including a hydroxyl group) as impurities. Moisture and hydrogen easily form a donor level and thus serve as impurities in the oxide semiconductor. In one implementation of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra-dry air (air with a moisture amount of 20 ppm (−55° C. by conversion into a dew point) or less, preferably 1 ppm or less, further preferably 10 ppb or less in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for about 3 minutes to 6 minutes. When an RTA method is used for the heat treatment, dehydration or dehydrogenation can be performed in a short time; therefore, treatment can be performed even at a temperature higher than the strain point of a glass substrate.

Note that in some cases, the heat treatment makes oxygen released from the oxide semiconductor film, and an oxygen defect is formed in the oxide semiconductor film. To prevent an oxygen defect, an insulating film including oxygen is used as an insulating film in contact with the oxide semiconductor film, such as a gate insulating film, in one implementation of the present invention. Then, heat treatment is performed after formation of the insulating film including oxygen, so that oxygen is supplied from the insulating film to the oxide semiconductor film. With the above structure, oxygen defects serving as donors can be reduced in the oxide semiconductor film and the stoichiometric composition of the oxide semiconductor included in the oxide semiconductor film can be satisfied. As a result, the oxide semiconductor film can be made substantially i-type and variations in electrical characteristics of transistors due to oxygen defects can be reduced; thus, electrical characteristics can be improved.

The heat treatment for supplying oxygen to the oxide semiconductor film is performed in a nitrogen atmosphere, ultra-dry air, or a rare gas (e.g., argon or helium) atmosphere preferably at temperatures ranging from 200° C. to 400° C., for example, from 250° C. to 350° C. The water content in the gas is preferably 20 ppm or less, more preferably 1 ppm or less, still more preferably 10 ppb or less.

The oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" also includes a range from 85° to 95°. In addition, a term "parallel" also includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the c-axes of the crystal parts are aligned in the direction parallel to a normal vector of the surface where the CAAC-OS film is formed or a normal vector of the surface of the CAAC-OS film. The crystal parts are formed by film formation or by performing treatment for crystallization such as heat treatment after film formation.

In a transistor using the CAAC-OS film, change in electrical characteristics due to irradiation with visible light or ultraviolet light is small. Thus, the transistor has high reliability.

Note that part of oxygen included in the oxide semiconductor film may be substituted with nitrogen.

Next, examples of a specific structure of a transistor in one implementation of the present invention will be described.

Figure 14A:
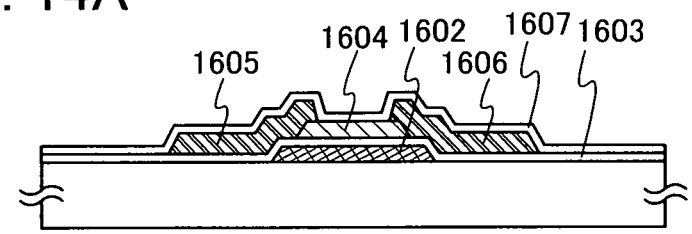
FIGS. 14A to 14D are diagrams for explaining transistors according to the present invention.

A transistor illustrated in FIG. 14A is a bottom-gate transistor with a channel-etched structure.

The transistor illustrated in FIG. 14A includes a gate electrode (gate) 1602 formed on an insulating surface, a gate insulating film 1603 over the gate electrode 1602, a semiconductor film 1604 that overlaps the gate electrode 1602 with the gate insulating film 1603 placed therebetween, and conductive films 1605 and 1606 formed over the semiconductor film 1604. An insulating film 1607 formed over the semiconductor film 1604 and the conductive films 1605 and 1606 may be considered as a component of the transistor.

The transistor in FIG. 14A may further include a backgate electrode that overlaps the semiconductor film 1604 with the insulating film 1607 placed therebetween.

Figure 14B:
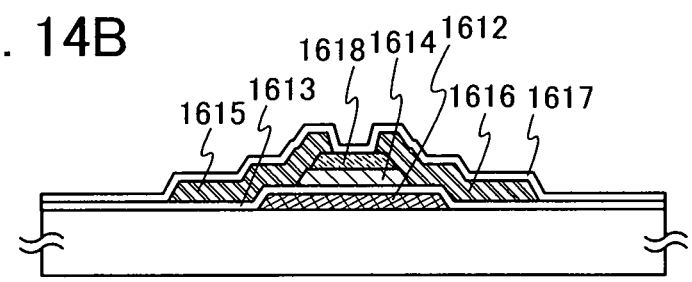

A transistor illustrated in FIG. 14B is a bottom-gate transistor with a channel protective structure.

The transistor illustrated in FIG. 14B includes a gate electrode 1612 formed on an insulating surface, a gate insulating film 1613 over the gate electrode 1612, a semiconductor film 1614 that overlaps the gate electrode 1612 with the gate insulating film 1613 placed therebetween, a channel protective film 1618 formed over the semiconductor film 1614, and conductive films 1615 and 1616 formed over the semiconductor film 1614. An insulating film 1617 formed over the channel protective film 1618 and the conductive films 1615 and 1616 may be considered as a component of the transistor.

The transistor in FIG. 14B may further include a backgate electrode that overlaps the semiconductor film 1614 with the insulating film 1617 placed therebetween.

The channel protective film 1618 can prevent the portion serving as a channel formation region in the semiconductor film 1614 from being damaged in a later step (e.g., from being reduced in thickness by plasma or an etchant in etching). As a result, the reliability of the transistor can be improved.

Figure 14C:
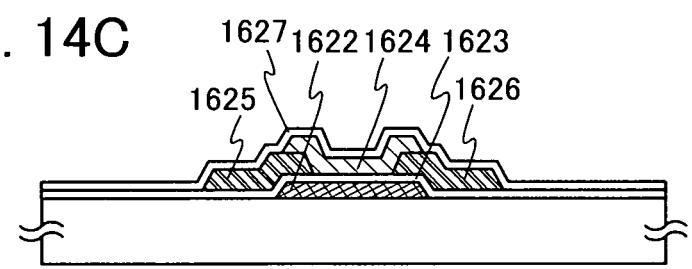

A transistor illustrated in FIG. 14C is a bottom-gate bottom-contact transistor.

The transistor illustrated in FIG. 14C includes a gate electrode 1622 formed on an insulating surface, a gate insulating film 1623 over the gate electrode 1622, conductive films 1625 and 1626 over the gate insulating film 1623, and a semiconductor film 1624 that overlaps the gate electrode 1622 with the gate insulating film 1623 placed therebetween and is formed over the conductive films 1625 and 1626. An insulating film 1627 formed over the conductive films 1625 and 1626 and the semiconductor film 1624 may be considered as a component of the transistor.

The transistor in FIG. 14C may further include a backgate electrode that overlaps the semiconductor film 1624 with the insulating film 1627 placed therebetween.

Figure 14D:
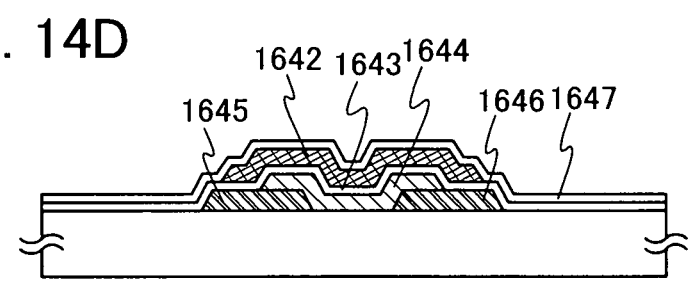

A transistor illustrated in FIG. 14D is a top-gate bottom-contact transistor.

The transistor illustrated in FIG. 14D includes conductive films 1645 and 1646 formed on an insulating surface, a semiconductor film 1644 formed over the insulating surface and the conductive films 1645 and 1646, a gate insulating film 1643 formed over the semiconductor film 1644 and the conductive films 1645 and 1646, and a gate electrode 1642 that overlaps the semiconductor film 1644 with the gate insulating film 1643 placed therebetween. An insulating film 1647 formed over the gate electrode 1642 may be considered as a component of the transistor.

The transistor in this implementation can be used as any of the transistors included in the basic circuits, the sequential circuits, and the shift register circuits described in Implementations 1 and 2 and any of the transistors included in the display device described in Implementation 3. It should be particularly noted that the mobility of the transistor including an oxide semiconductor is high and the off-state current thereof is low. Consequently, the basic circuits, the sequential circuits, and the shift register circuits described in Implementations 1 and 2 and the display device described in Implementation 3 can operate at high speed. In addition, charge leaked from each noted can be decreased.

This implementation can be implemented in appropriate combination with any of the other implementations and the like.

Implementation 5

The basic circuits, the sequential circuits, the shift register circuits, and the display device according to implementations of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the basic circuits, the sequential circuits, the shift register circuits, and the display device according to implementations of the present invention are mobile phones, game consoles including portable game consoles, personal information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15E illustrate specific examples of these electronic devices.

Figure 15A:
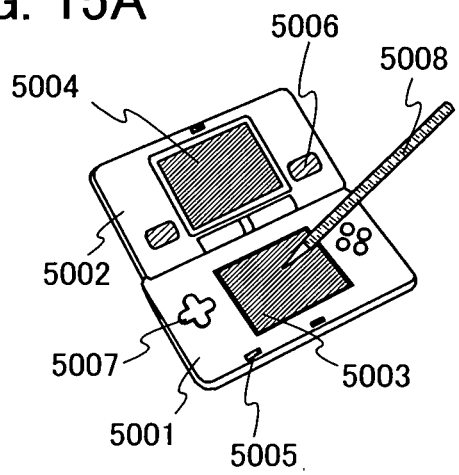
FIGS. 15A to 15E are diagrams for explaining electronic devices according to the present invention.

FIG. 15A illustrates a portable game console including a housing 5001, a housing 5002, a display portion 5003, a display portion 5004, a microphone 5005, a speaker 5006, an operation key 5007, a stylus 5008, and the like. Note that although the portable game console in FIG. 15A includes the two display portions 5003 and 5004, the number of display portions included in the portable game console is not limited to two.

Figure 15B:
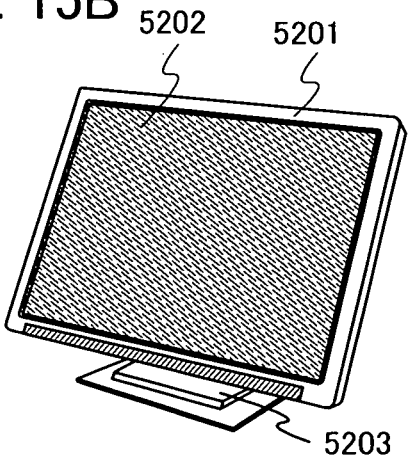

FIG. 15B illustrates a display device including a housing 5201, a display portion 5202, a support base 5203, and the like. Note that a display device includes, in its category, any display device for displaying information, such as display devices for personal computers, TV broadcast reception, and advertisement.

Figure 15C:
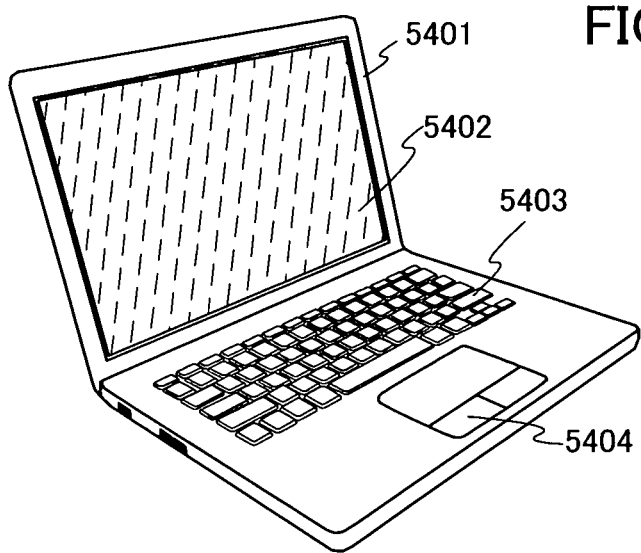

FIG. 15C illustrates a laptop personal computer including a housing 5401, a display portion 5402, a keyboard 5403, a pointing device 5404, and the like.

Figure 15D:
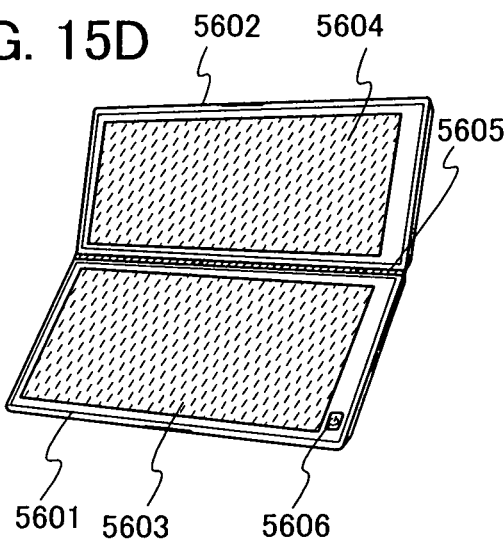

FIG. 15D illustrates a personal digital assistant including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched in accordance with the angle between the first housing 5601 and the second housing 5602 using the joint 5605.

Figure 15E:
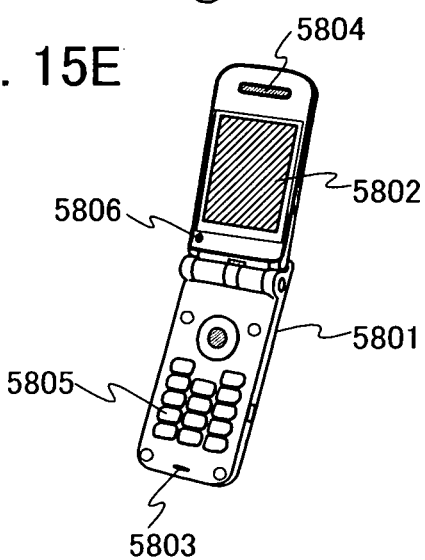

FIG. 15E illustrates a mobile phone including a housing 5801, a display portion 5802, an audio input portion 5803, an audio output portion 5804, operation keys 5805, a light-receiving portion 5806, and the like. Light received by the light-receiving portion 5806 is converted into electrical signals, whereby external images can be loaded.

This implementation can be implemented in appropriate combination with any of the other implementations and the like.

This application is based on Japanese Patent Application serial no. 2012-042864 filed with Japan Patent Office on Feb. 29, 2012, the entire contents of which are hereby incorporated by reference.

What is claimed is:

1. A semiconductor device comprising:
   a gate driver; and
   a pixel;
   wherein the gate driver comprises a first transistor, a second transistor, a third transistor, a fourth transistor, a fifth transistor, a sixth transistor, a seventh transistor,
   wherein one of a source and a drain of the first transistor is electrically connected to one of a source and a drain of the second transistor,
   wherein the one of the source and the drain of the first transistor is electrically connected to a first wiring,
   wherein the other of the source and the drain of the first transistor is electrically connected to a first power supply line,
   wherein the other of the source and the drain of the second transistor is electrically connected to a second power supply line,
   wherein one of a source and a drain of the third transistor is electrically connected to one of a source and a drain of the fourth transistor,
   wherein the one of the source and the drain of the third transistor is electrically connected to a gate of the first transistor,
   wherein the one of the source and the drain of the third transistor is electrically connected to a gate of the sixth transistor,
   wherein a gate of the third transistor is electrically connected to a second wiring,
   wherein the other of the source and the drain of the fourth transistor is electrically connected to the second power supply line,
   wherein one of a source and a drain of the fifth transistor is electrically connected to one of a source and a drain of the sixth transistor,
   wherein the one of the source and the drain of the sixth transistor is electrically connected to a gate of the second transistor, wherein the other of the source and the drain of the fifth transistor is electrically connected to a third wiring, wherein the other of the source and the drain of the sixth transistor is electrically connected to the second power supply line, wherein one of a source and a drain of the seventh transistor is electrically connected to a gate of the fourth transistor, wherein the one of the source and the drain of the seventh transistor is electrically connected to a gate of the fifth transistor, wherein a gate of the seventh transistor is electrically connected to the second wiring, wherein a first clock signal is input to the second wiring, wherein a second clock signal is input to the third wiring, wherein a ratio of a channel width to a channel length of the first transistor is larger than a ratio of a channel width to a channel length of the third transistor, wherein the ratio of the channel width to the channel length of the first transistor is larger than a ratio of a channel width to a channel length of the fourth transistor, wherein the ratio of the channel width to the channel length of the first transistor is larger than a ratio of a channel width to a channel length of the fifth transistor, wherein the ratio of the channel width to the channel length of the first transistor is larger than a ratio of a channel width to a channel length of the sixth transistor, wherein the ratio of the channel width to the channel length of the first transistor is larger than a ratio of a channel width to a channel length of the seventh transistor, wherein a ratio of a channel width to a channel length of the second transistor is larger than the ratio of the channel width to the channel length of the fourth transistor, wherein the pixel comprises an eighth transistor, a ninth transistor and a light emitting element, wherein one of a source and a drain of the eighth transistor is electrically connected to one of a source and a drain of the ninth transistor, wherein the other of the source and the drain of the ninth transistor is electrically connected to the light emitting element, and wherein a gate of one of the eighth transistor and the ninth transistor is electrically connected to the first wiring.

2. A semiconductor device comprising:

a gate driver, wherein the gate driver comprises a first transistor, a second transistor, a third transistor, a fourth transistor, a fifth transistor, a sixth transistor, a seventh transistor, wherein one of a source and a drain of the first transistor is electrically connected to one of a source and a drain of the second transistor, wherein the one of the source and the drain of the first transistor is electrically connected to a first wiring, wherein the other of the source and the drain of the first transistor is electrically connected to a first power supply line, wherein the other of the source and the drain of the second transistor is electrically connected to a second power supply line, wherein one of a source and a drain of the third transistor is electrically connected to one of a source and a drain of the fourth transistor, wherein the one of the source and the drain of the third transistor is electrically connected to a gate of the first transistor, wherein the one of the source and the drain of the third transistor is electrically connected to a gate of the sixth transistor, wherein a gate of the third transistor is electrically connected to a second wiring, wherein the other of the source and the drain of the fourth transistor is electrically connected to the second power supply line, wherein one of a source and a drain of the fifth transistor is electrically connected to one of a source and a drain of the sixth transistor, wherein the one of the source and the drain of the sixth transistor is electrically connected to a gate of the second transistor, wherein the other of the source and the drain of the fifth transistor is electrically connected to a third wiring, wherein the other of the source and the drain of the sixth transistor is electrically connected to the second power supply line, wherein one of a source and a drain of the seventh transistor is electrically connected to a gate of the fourth transistor, wherein one of the source and the drain of the seventh transistor is electrically connected to a gate of the fifth transistor, wherein a gate of the seventh transistor is electrically connected to the second wiring.

3. A semiconductor device comprising:

a gate driver; and a pixel;

wherein the gate driver comprises a first transistor, a second transistor, a third transistor, a fourth transistor, a fifth transistor, a sixth transistor, a seventh transistor, wherein one of a source and a drain of the first transistor is electrically connected to one of a source and a drain of the second transistor, wherein the one of the source and the drain of the first transistor is electrically connected to a first wiring, wherein the other of the source and the drain of the first transistor is electrically connected to a first power supply line, wherein the other of the source and the drain of the second transistor is electrically connected to a second power supply line, wherein one of a source and a drain of the third transistor is electrically connected to one of a source and a drain of the fourth transistor, wherein the one of the source and the drain of the third transistor is electrically connected to a gate of the first transistor, wherein the one of the source and the drain of the third transistor is electrically connected to a gate of the sixth transistor, wherein a gate of the third transistor is electrically connected to a second wiring, wherein the other of the source and the drain of the fourth transistor is electrically connected to the second power supply line, wherein one of a source and a drain of the fifth transistor is electrically connected to one of a source and a drain of the sixth transistor, wherein the one of the source and the drain of the sixth transistor is electrically connected to a gate of the second transistor, wherein the other of the source and the drain of the fifth transistor is electrically connected to a third wiring, wherein the other of the source and the drain of the sixth transistor is electrically connected to the second power supply line, wherein one of a source and a drain of the seventh transistor is electrically connected to a gate of the fourth transistor, wherein the one of the source and the drain of the seventh transistor is electrically connected to a gate of the fifth transistor, wherein a gate of the seventh transistor is electrically connected to the second wiring, wherein a ratio of a channel width to a channel length of the first transistor is larger than a ratio of a channel width to a channel length of the third transistor, wherein the ratio of the channel width to the channel length of the first transistor is larger than a ratio of a channel width to a channel length of the fourth transistor, wherein the ratio of the channel width to the channel length of the first transistor is larger than a ratio of a channel width to a channel length of the fifth transistor, wherein the ratio of the channel width to the channel length of the first transistor is larger than a ratio of a channel width to a channel length of the sixth transistor, wherein the ratio of the channel width to the channel length of the first transistor is larger than a ratio of a channel width to a channel length of the seventh transistor, wherein a ratio of a channel width to a channel length of the second transistor is larger than the ratio of the channel width to the channel length of the fourth transistor, wherein the pixel comprises an eighth transistor, a ninth transistor and a light emitting element, wherein one of a source and a drain of the eighth transistor is electrically connected to one of a source and a drain of the ninth transistor, wherein the other of the source and the drain of the ninth transistor is electrically connected to the light emitting element, and wherein a gate of one of the eighth transistor and the ninth transistor is electrically connected to the first wiring.

* * * * *